(12) United States Patent
Hatakeyama et al.

(10) Patent No.: US 9,810,983 B2
(45) Date of Patent: Nov. 7, 2017

(54) POLYMER, CHEMICALLY AMPLIFIED POSITIVE RESIST COMPOSITION AND PATTERNING PROCESS

(71) Applicant: SHIN-ETSU CHEMICAL CO., LTD., Tokyo (JP)

(72) Inventors: Jun Hatakeyama, Joetsu (JP); Koji Hasegawa, Joetsu (JP); Masayoshi Sagehashi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/185,195

(22) Filed: Jun. 17, 2016

(65) Prior Publication Data

US 2016/0370702 A1 Dec. 22, 2016

(30) Foreign Application Priority Data

Jun. 19, 2015 (JP) ................. 2015-124100

(51) Int. Cl.
| | | |
|---|---|---|
| *G03F 7/039* | (2006.01) | |
| *C08F 220/16* | (2006.01) | |
| *C08F 224/00* | (2006.01) | |
| *G03F 7/32* | (2006.01) | |
| *C08F 222/20* | (2006.01) | |
| *G03F 7/004* | (2006.01) | |
| *G03F 7/085* | (2006.01) | |

(52) U.S. Cl.
CPC .......... *G03F 7/0392* (2013.01); *C08F 220/16* (2013.01); *C08F 222/20* (2013.01); *C08F 224/00* (2013.01); *G03F 7/0045* (2013.01); *G03F 7/0046* (2013.01); *G03F 7/0395* (2013.01); *G03F 7/0397* (2013.01); *G03F 7/085* (2013.01)

(58) Field of Classification Search
CPC .... G03F 7/0392; G03F 7/2004; G03F 7/2059; G03F 7/168; G03F 7/322; C08F 222/20; C08F 220/16; C08F 224/00
See application file for complete search history.

(56) References Cited

U.S. PATENT DOCUMENTS

| | | | |
|---|---|---|---|
| 6,746,817 B2 | 6/2004 | Takeda et al. | |
| 7,482,108 B2 | 1/2009 | Matsumaru et al. | |
| 9,017,918 B2 | 4/2015 | Hatakeyama et al. | |
| 2013/0323646 A1* | 12/2013 | Hatakeyama | G03F 7/0395 430/285.1 |
| 2013/0344442 A1* | 12/2013 | Sagehashi | G03F 7/004 430/285.1 |
| 2016/0109803 A1* | 4/2016 | Hatakeyama | G03F 7/325 430/270.1 |
| 2016/0147150 A1* | 5/2016 | Hatakeyama | G03F 7/2004 430/285.1 |
| 2016/0168296 A1* | 6/2016 | Hatakeyama | C08F 224/00 430/270.1 |
| 2016/0229940 A1* | 8/2016 | Hatakeyama | C08F 236/02 |

FOREIGN PATENT DOCUMENTS

| | | |
|---|---|---|
| JP | 2005-84365 A | 3/2005 |
| JP | 2006-45311 A | 2/2006 |
| JP | 2006-169302 A | 6/2006 |
| JP | 3865048 B2 | 1/2007 |
| JP | 2012-12577 A | 1/2012 |

OTHER PUBLICATIONS

Paul et al ,"A High Functionality Crosslinked Resin from 3,5-Diacryloyloxybenzoic Acid and Studies of Its De-Crosslinking", Macromol. Chem. Phys. 2001, 202, 2872-2879.*

* cited by examiner

*Primary Examiner* — Cynthia Hamilton
(74) *Attorney, Agent, or Firm* — Westerman, Hattori, Daniels & Adrian, LLP

(57) ABSTRACT

A positive resist composition comprising a polymer comprising recurring units having both an acyl or alkoxycarbonyl group and an acid labile group-substituted hydroxyl group exhibits a high contrast of alkaline dissolution rate before and after exposure, a high resolution, a good pattern profile and minimal edge roughness.

13 Claims, No Drawings

POLYMER, CHEMICALLY AMPLIFIED POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2015-124100 filed in Japan on Jun. 19, 2015, the entire contents of which are hereby incorporated by reference.

TECHNICAL FIELD

This invention relates to a polymer, a positive resist composition, especially a chemically amplified positive resist composition comprising the polymer, and a patterning process using the composition.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, EUV lithography of wavelength 13.5 nm, and double patterning version of the ArF lithography, on which active research efforts have been made.

With respect to high-energy radiation of very short wavelength such as electron beam (EB) or x-ray, hydrocarbons and similar light elements used in resist materials have little absorption. Then polyhydroxystyrene base resist materials are under consideration.

Resist materials for EB lithography are practically used in the mask image writing application. Recently, the mask manufacturing technology becomes of greater interest. Reduction projection exposure systems or steppers have been used since the time when the exposure light was g-line. While their demagnification factor was ⅕, a factor of ¼ is now used as a result of chip size enlargement and projection lens diameter increase. It becomes of concern that a dimensional error of a mask has an impact on the dimensional variation of a pattern on wafer. It is pointed out that as the pattern feature is reduced, the value of a dimensional variation on the wafer becomes greater than the value of a dimensional error of the mask. This is evaluated by a mask error enhancement factor (MEEF) which is a dimensional variation on wafer divided by a dimensional error of mask. Patterns on the order of 45 nm often show an MEEF in excess of 4. In a situation including a demagnification factor of ¼ and a MEEF of 4, the mask manufacture needs an accuracy substantially equivalent to that for equi-magnification masks.

The exposure system for mask manufacturing made a transition from the laser beam exposure system to the EB exposure system to increase the accuracy of line width. Since a further size reduction becomes possible by increasing the accelerating voltage of the electron gun in the EB exposure system, the accelerating voltage increased from 10 kV to 30 kV and reached 50 kV in the current mainstream system, with a voltage of 100 keV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are contemplated.

Thinning of resist film is in progress to facilitate reduction of pattern feature in the EH lithography for mask manufacturing and to prevent the pattern from collapsing due to a higher aspect ratio during development. In the case of photolithography, a thinning of resist film greatly contributes to resolution improvement. This is because introduction of chemical mechanical polishing (CMP) or the like has driven forward device planarization. In the case of mask manufacture, substrates are flat, and the thickness of processable substrates (e.g., Cr, MoSi or $SiO_2$) is predetermined by a percent light shield or phase shift control. The resist film must be improved in dry etch resistance before it can be reduced in thickness.

It is generally believed that there is a correlation between the carbon density and the dry etch resistance of resist film. As carbon density increases, etch resistance improves. Indene copolymers described in Patent Document 1 and acenaphthylene copolymers described in Patent Document 2 are expected to have a high carbon density and improved etch resistance due to a robust main chain of cycloolefin structure.

Also, with respect to the soft x-ray (EUV) lithography at wavelength 5-20 nm, the reduced absorption of carbon atoms was reported. Increasing the carbon density is effective not only for improving dry etch resistance, but also for increasing the transmittance in the soft x-ray wavelength region.

As the feature size is reduced, image blurs due to acid diffusion become a problem. To insure resolution for fine patterns with a size of 45 nm et seq., not only an improvement in dissolution contrast is requisite, but control of acid diffusion is also important, as known from previous reports. Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast. Since the distance of acid diffusion is closely related to the type of acid labile group, it would be desirable to have an acid labile group which permits deprotection reaction to proceed at a very short distance of acid diffusion.

It is known that a resist polymer comprising recurring units of a carboxylic acid (typically methacrylic acid) having a carboxyl group substituted with an acid labile group will swell in alkaline developer. If the polymer swells during development, formation of bridge defects between pattern features or pattern collapse may occur after the development.

A polymer having a phenol group resulting from deprotection of an acid labile group experiences less swell in alkaline developer and is thus less susceptible to pattern collapse (due to swell) after development. However, the dissolution rate in alkaline developer of polyhydroxystyrene is lower than that of polymethacrylate by one order, that is, its dissolution contrast is low. Undesirably a low dissolution contrast leads to a narrow focus margin.

Patent Document 3 describes a hydroxyphenyl methacrylate substituted with an acid labile group. The alkali dissolution rate of poly(hydroxyphenyl methacrylate) is greater than that of polyhydroxystyrene by a factor of at least 2, from which an expansion of focus margin is expectable, but to an insufficient extent. It is desired to have acid labile units having a protected dissolving group which have a high dissolution contrast and experience little swell.

Addition of an acid generator capable of generating a bulky acid is effective for suppressing acid diffusion. It is then proposed to copolymerize a polymer with an acid generator in the form of an onium salt having polymerizable olefin. Patent Documents 4 and 5 disclose sulfonium salts having polymerizable olefin capable of generating a sulfonic acid and similar iodonium salts.

CITATION LIST

Patent Document 1: JP 3865048

Patent Document 2: JP-A 2006-169302

Patent Document 3: JP-A 2012-012577

Patent Document 4: JP-A 2005-084365

Patent Document 5: JP-A 2006-045311 (U.S. Pat. No. 7,482,108)

DISCLOSURE OF INVENTION

An object of the present invention is to provide a positive resist composition, typically chemically amplified positive resist composition, comprising a specific polymer, which exhibits a high resolution surpassing prior art positive resist compositions, and forms a resist film having a minimal edge roughness (LER or LWR) and a good pattern profile after exposure. Another object is to provide a pattern forming process using the same.

Making investigations to seek for a positive resist composition which exhibits a high sensitivity, high resolution, and minimal edge roughness, the inventors have found that better results are obtained when a polymer comprising recurring units having an electron attractive group in the form of an acyl or alkoxycarbonyl group and a hydroxyl group substituted with an acid labile group is used as a base resin to formulate a positive resist composition, typically chemically amplified positive resist composition. Because of advantages including a significantly high contrast of alkaline dissolution rate before and after exposure, an acid diffusion suppressing effect, a high resolution, a good pattern profile after exposure, and a satisfactory edge roughness, the resulting positive resist composition, typically chemically amplified positive resist composition is best suited as the fine pattern-forming material for the manufacture of VLSIs and photomasks.

In one aspect, the invention provides a polymer comprising recurring units (a1) having the general formula (1), the polymer having a weight average molecular weight of 1,000 to 500,000.

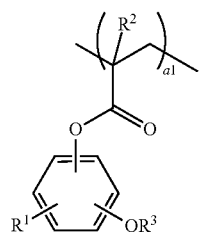

Herein $R^1$ is $-C(=O)-R^4$, $-O-C(=O)-R^4$ or $-C(=O)-O-R^4$, $R^2$ is hydrogen or methyl, $R^3$ is an acid labile group, and $R^4$ is a straight or branched $C_1$-$C_4$ alkyl group or $C_2$-$C_4$ alkenyl group.

Typically $R^3$ is an acid labile group selected from among t-butyl, t-pentyl, methylcyclopentyl, ethylcyclopentyl, methylcyclohexyl, ethylcyclohexyl, methyladamantyl, ethyladamantyl, t-butoxycarbonyl, t-pentyloxycarbonyl and $-CR^5R^6-O-R^7$ wherein $R^5$ and $R^6$ are each independently hydrogen or a straight or branched $C_1$-$C_4$ alkyl group, and $R^7$ is a straight, branched or cyclic $C_1$-$C_{12}$ alkyl group or $C_2$-$C_{12}$ alkenyl group.

The polymer may further comprise recurring units (b) having an adhesive group selected from among hydroxyl, carboxyl, lactone ring, carbonate, thiocarbonate, carbonyl, cyclic acetal, ether, ester, sulfonic acid ester, cyano, amide, and $-O-C(=O)$-G- wherein G is sulfur or NH, the recurring units (a1) and (b) being incorporated in a fraction: $0 < a1 < 1.0$, $0 < b < 1.0$, and $0.05 \leq a1 + b \leq 1.0$.

Preferably, the recurring units (b) are units having a phenolic hydroxyl group. More preferably, the recurring units having a phenolic hydroxyl group are units of at least one type selected from recurring units (b 1) to (b8) represented by the general formula (2).

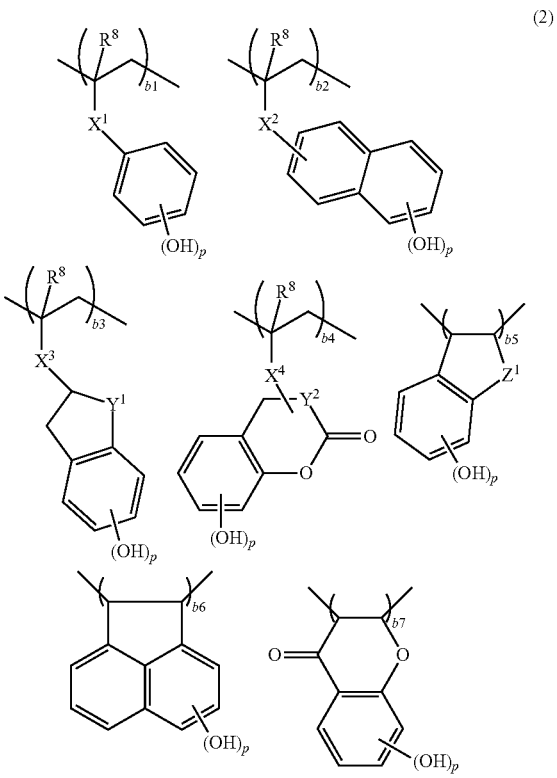

-continued

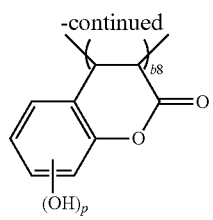

Herein $R^8$ is hydrogen or methyl, $X^1$ and $X^2$ each are a single bond or —C(=O)—O—$R^9$—, $X^3$ and $X^4$ each are —C(=O)—O—$R^9$—, $R^9$ is a single bond or a straight, branched or cyclic $C_1$-$C_{10}$ alkylene group, $Y^1$ and $Y^2$ each are methylene or ethylene, $Z^1$ is methylene, oxygen or sulfur, p is 1 or 2, b1 to b8 are numbers in the range: $0 \leq b1 < 1.0$, $0 \leq b2 < 1.0$, $0 \leq b3 < 1.0$, $0 \leq b4 < 1.0$, $0 \leq b5 < 1.0$, $0 \leq b6 < 1.0$, $0 \leq b7 < 1.0$, $0 \leq b8 < 1.0$, and $0 < b1+b2+b3+b4+b5+b6+b7+b8 < 1.0$.

The polymer may further comprise recurring units (a2) having the general formula (5).

(5)

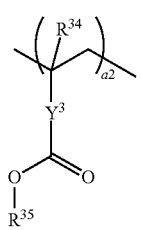

Herein $R^{34}$ is hydrogen or methyl, $R^{35}$ is an acid labile group, $Y^3$ is a single bond, a divalent $C_1$-$C_{12}$ linking group having an ester moiety, ether moiety or lactone ring, phenylene group or naphthylene group, a2 is a number in the range: $0 \leq a2 < 1.0$.

The polymer may further comprise recurring units (c) of at least one type selected from recurring units (c1) to (c5) of indene, acenaphthylene, chromone, coumarin, and norbornadiene derivatives, represented by the general formula (3).

(3)

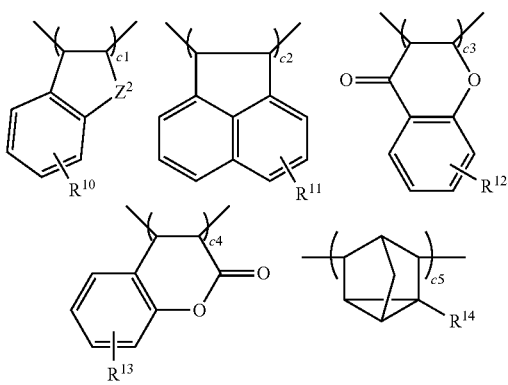

Herein $R^{10}$ to $R^{14}$ are each independently hydrogen. $C_1$-$C_{30}$ alkyl, halo-substituted $C_1$-$C_{30}$ alkyl, $C_1$-$C_8$ alkoxy, $C_1$-$C_8$ alkanoyl, $C_2$-$C_8$ alkoxycarbonyl, $C_6$-$C_{10}$ aryl, halogen, or 1,1,1,3,3,3-hexafluoro-2-propanol, $Z^2$ is methylene, oxygen or sulfur, c1 to c5 are numbers in the range: $0 \leq c1 < 1.0$, $0 \leq c2 < 1.0$, $0 \leq c3 < 1.0$, $0 \leq c4 < 1.0$, $0 \leq c5 < 1.0$, and $0 < c1+c2+c3+c4+c5 < 1.0$.

The polymer may further comprise recurring units (d) derived from an onium salt having polymerizable olefin as an acid generator. The recurring units (d) are units of at least one type selected from recurring units (d1) to (d3) of sulfonium salt, represented by the general formula (4).

(4)

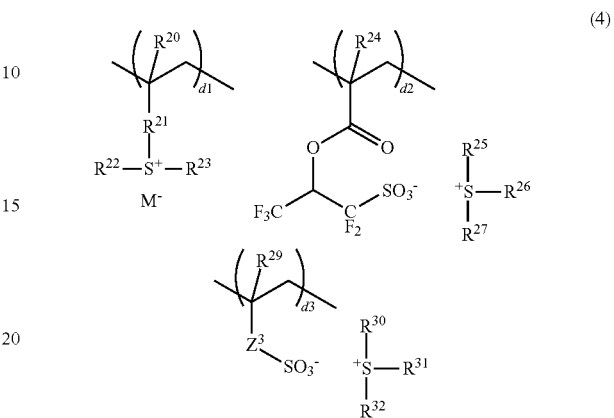

Herein $R^{20}$, $R^{24}$, and $R^{29}$ each are hydrogen or methyl, $R^{21}$ is a single bond, phenylene, or —O—$R^{28}$—, or —C(=O)—$Y^4$—$R^{28}$—, $Y^4$ is oxygen or NH, $R^{28}$ is a straight, branched or cyclic $C_1$-$C_6$ alkylene, phenylene or alkenylene group, which may contain a carbonyl, ester, ether or hydroxyl moiety, $R^{22}$, $R^{23}$, $R^{25}$, $R^{26}$, $R^{27}$, $R^{30}$, $R^{31}$, and $R^{32}$ are each independently a straight, branched or cyclic $C_1$-$C_{12}$ alkyl, $C_6$-$C_{12}$ aryl or $C_7$-$C_{20}$ aralkyl group, which may contain a carbonyl, ester or ether moiety, $Z^3$ is a single bond, methylene, ethylene, phenylene, fluorophenylene, —O—$R^{33}$—, or —C(=O)—$Z^4$—$R^{33}$—, $Z^4$ is oxygen or NH, $R^{33}$ is a straight, branched or cyclic $C_1$-$C_6$ alkylene, phenylene or alkenylene group, which may contain a carbonyl, ester, ether or hydroxyl moiety, $M^-$ is a non-nucleophilic counter ion, d1, d2 and d3 are numbers in the range of $0 \leq d1 \leq 0.5$, $0 \leq d2 \leq 0.5$, $0 \leq d3 \leq 0.5$, and $0 < d1+d2+d3 \leq 0.5$.

In another aspect, the invention provides a chemically amplified positive resist composition comprising the polymer defined above and an organic solvent.

The resist composition may further comprise a dissolution regulator, an acid generator, a basic compound, and/or a surfactant.

In a further aspect, the invention provides a pattern forming process comprising the steps of applying the chemically amplified positive resist composition defined above onto a substrate, prebaking, exposing to high-energy radiation, and developing in a developer. The high-energy radiation is typically KrF excimer laser, ArF excimer laser, soft X-ray of wavelength 3 to 15 nm, or EB.

The positive resist composition, typically chemically amplified positive resist composition is used not only in the lithography for forming semiconductor circuits, but also in the formation of mask circuit patterns, micromachines, and thin-film magnetic head circuits.

ADVANTAGEOUS EFFECTS OF INVENTION

The positive resist composition comprising the inventive polymer as base resin exhibits a remarkably high contrast of alkaline dissolution rate before and after exposure, a high resolution, a good pattern profile and minimal edge roughness after exposure, a significant effect of suppressing acid diffusion rate, and improved etch resistance. The composition is thus suited as a fine pattern-forming material for the fabrication of VLSIs or photomasks and a pattern-forming material for EUV lithography.

DESCRIPTION OF EMBODIMENTS

The singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group. In the chemical formula, the broken line designates a valence bond.

The abbreviations have the following meaning.
EB: electron beam
EUV: extreme ultraviolet
PAG: photoacid generator
PEB: post-exposure bake
LER: line edge roughness
LWR: line width roughness The invention provides a polymer comprising recurring units (a1) represented by the general formula (1) and having a weight average molecular weight of 1,000 to 500,000.

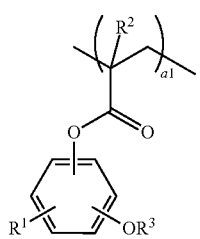

(1)

Herein $R^1$ is $-C(=O)-R^4$, $-O-C(=O)-R^4$ or $-C(=O)-O-R^4$, $R^2$ is hydrogen or methyl, $R^3$ is an acid labile group, and $R^4$ is a straight or branched $C_1$-$C_4$ alkyl group or $C_2$-$C_4$ alkenyl group.

The acid labile group represented by $R^3$ is typically t-butyl, t-pentyl, methylcyclopentyl, ethylcyclopentyl, methylcyclohexyl, ethylcyclohexyl, methyladamantyl, ethyladamantyl, t-butoxycarbonyl, t-pentyloxycarbonyl or $-CR^5R^6-O-R^7$ wherein $R^5$ and $R^6$ are each independently hydrogen or a straight or branched $C_1$-$C_4$ alkyl group, and $R^7$ is a straight, branched or cyclic $C_1$-$C_{12}$ alkyl group or $C_2$-$C_{12}$ alkenyl group.

$R^4$ is a straight or branched $C_1$-$C_4$ alkyl group or $C_2$-$C_4$ alkenyl group. Suitable $C_1$-$C_4$ alkyl groups include methyl, ethyl, n-propyl, isopropyl, n-butyl, isobutyl, sec-butyl, and t-butyl. Suitable $C_2$-$C_4$ alkenyl groups include vinyl, allyl, isopropenyl, ethynyl, 2-propynyl, 1-propenyl, 2-butenyl, and 1,3-butadienyl.

The monomer Ma1 from which recurring units (a1) having formula (1) are derived has the following formula.

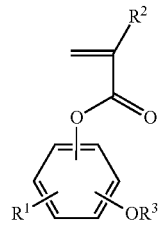

Ma1

Herein $R^1$ to $R^3$ are as defined above.

Examples of the monomer Ma1 from which recurring units (a1) are derived are shown below, but not limited thereto.

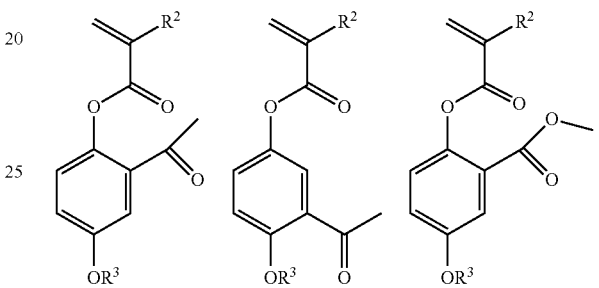

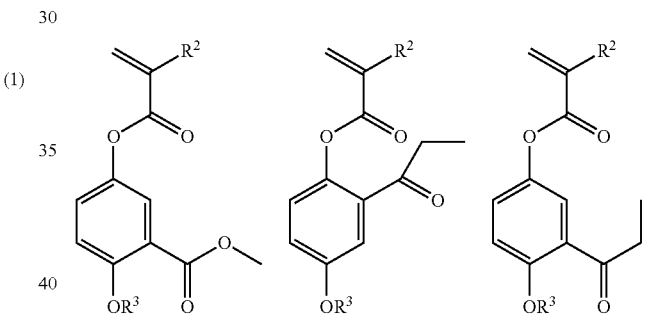

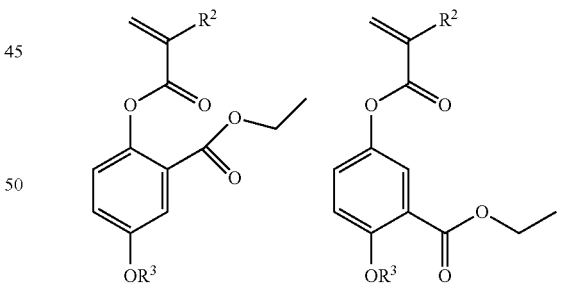

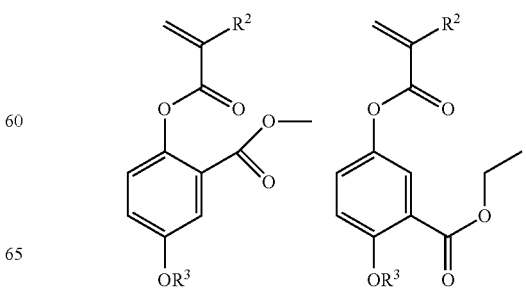

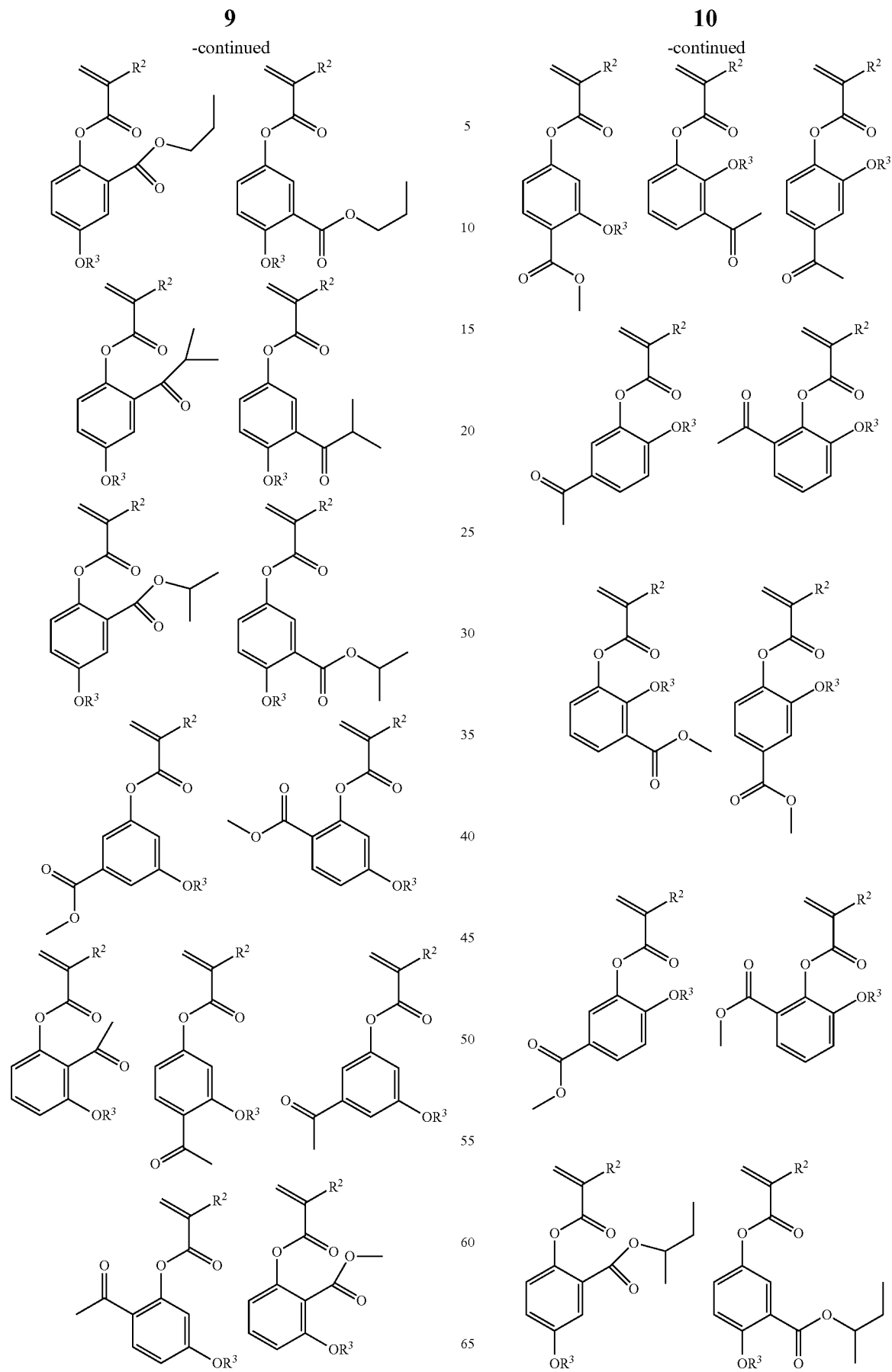

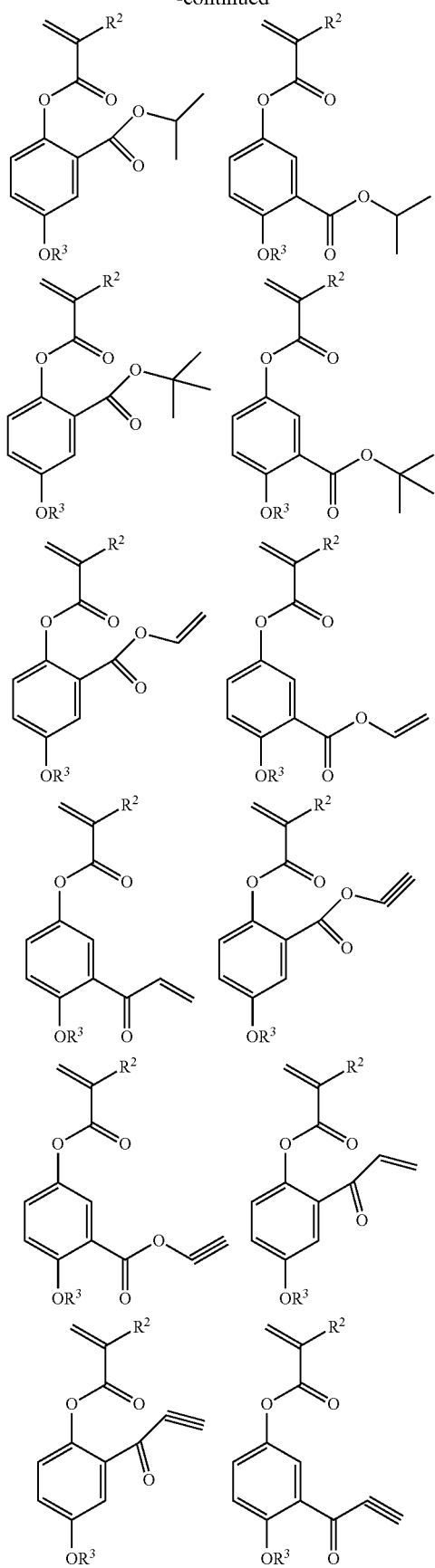
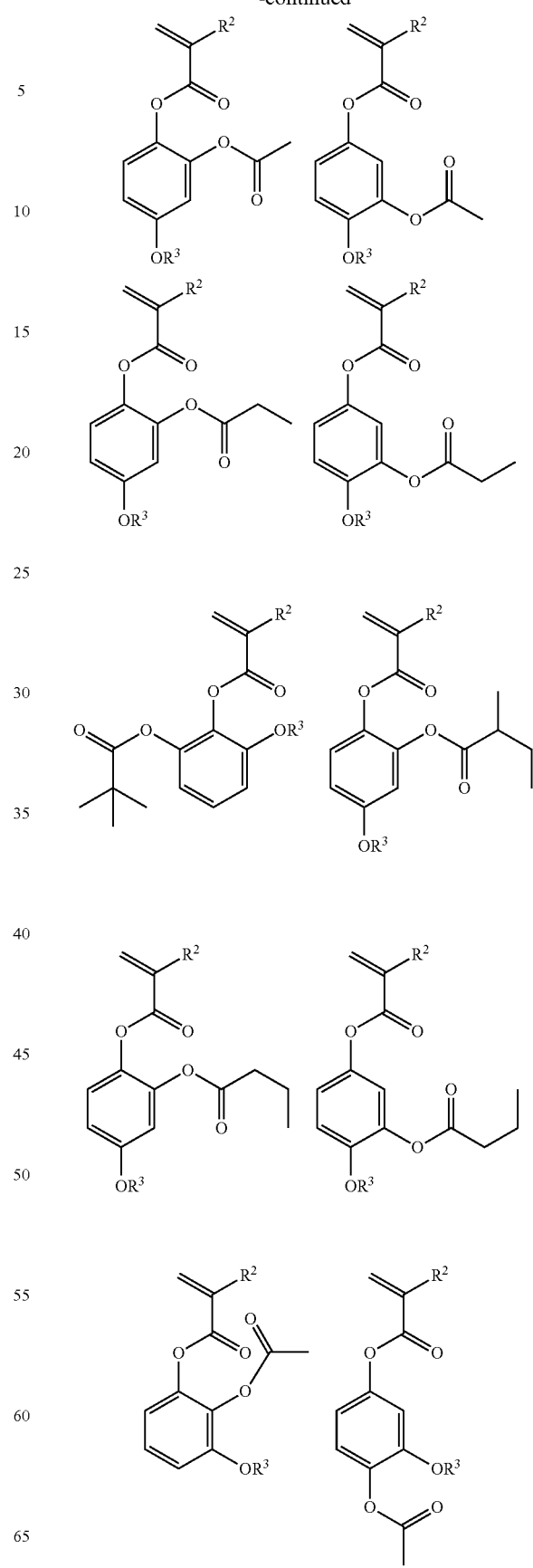

-continued
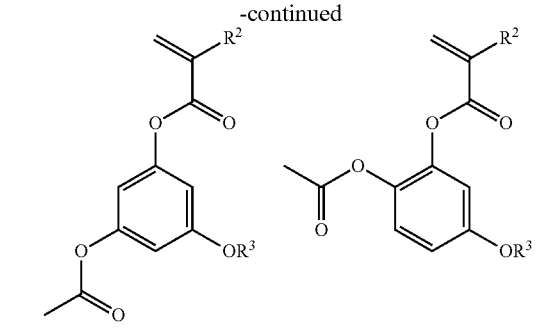
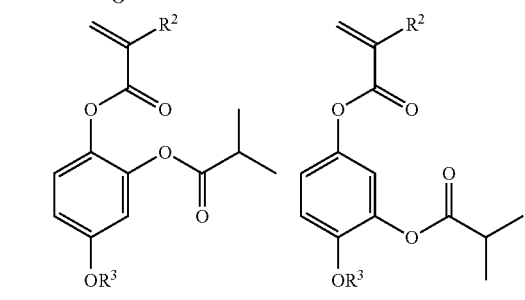
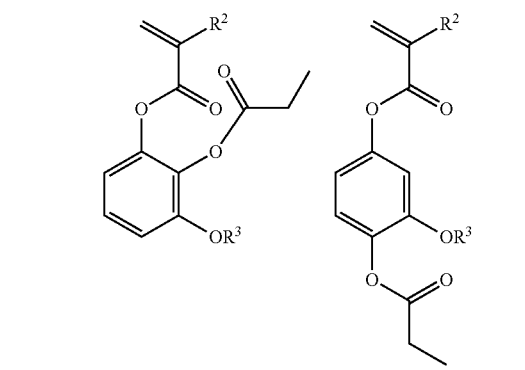
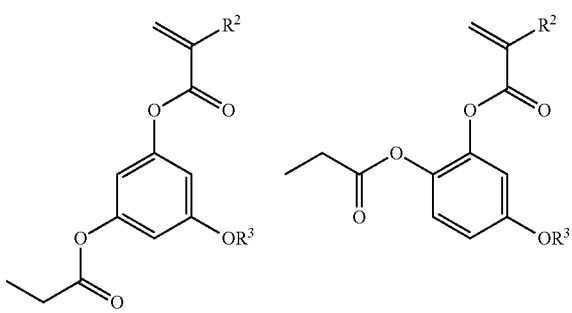
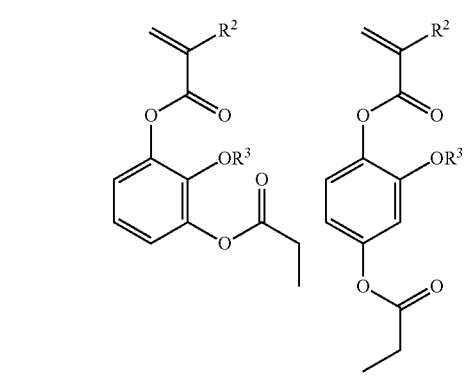
-continued
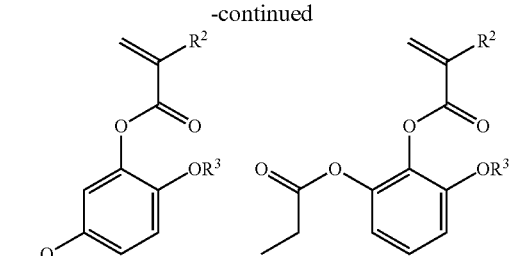
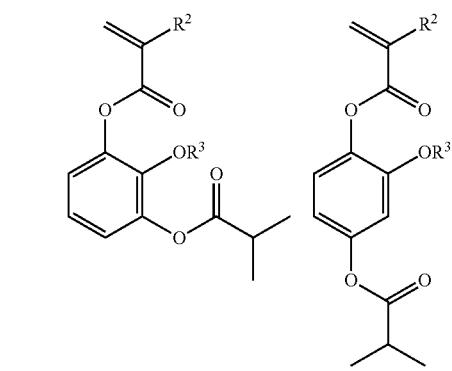
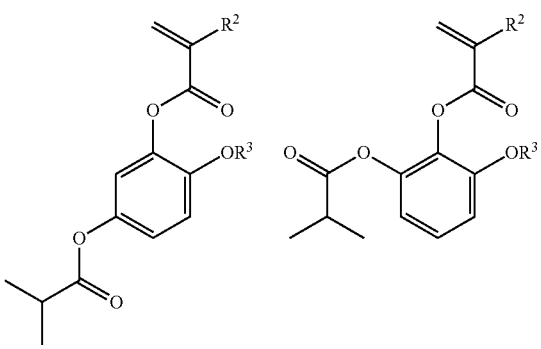
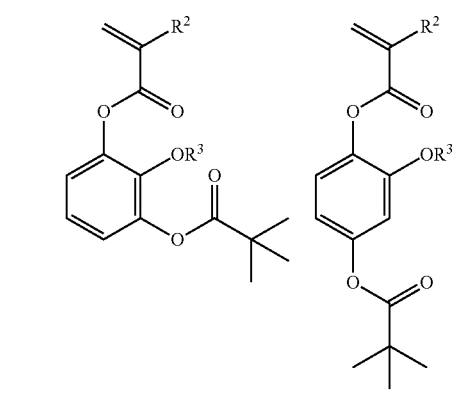

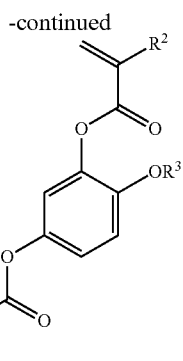

Herein R² and R³ are as defined above.

The monomer Ma1 may be prepared, for example, by steps i) to v) as shown in the following reaction scheme although the synthesis route is not limited thereto.

Step i) is to convert a monomer (1A) having a phenolic hydroxyl group to the desired monomer Ma1 by protecting the phenolic hydroxyl group. The reaction of step i) readily takes place under well-known conditions. For example, a monomer Ma1 wherein R³ is a tertiary alkyl group such as t-butyl, t-pentyl, methylcyclopentyl, ethylcyclopentyl, methyloyclohexyl, ethylcyclohexyl, methyladamantyl or ethyladamantyl may be prepared by mixing a monomer (1A) and an olefin corresponding to R³ such as isobutene or isopentylene in a solventless system or in a solvent such as toluene or hexane, and effecting reaction in the presence of an acid catalyst and at a temperature of −20° C. to 50° C. Examples of the acid catalyst used herein include mineral acids such as hydrochloric acid, sulfuric acid, nitric acid and perchioric acid and organic acids such as methanesulfonic acid, trifluoromethanesulfonic acid, p-toluenesulfonic acid, and benzenesulfonic acid.

Step ii) is to convert a hydroquinone derivative (1B) to an intermediate phenol compound (1C) by protection. The reaction may be performed as in step i).

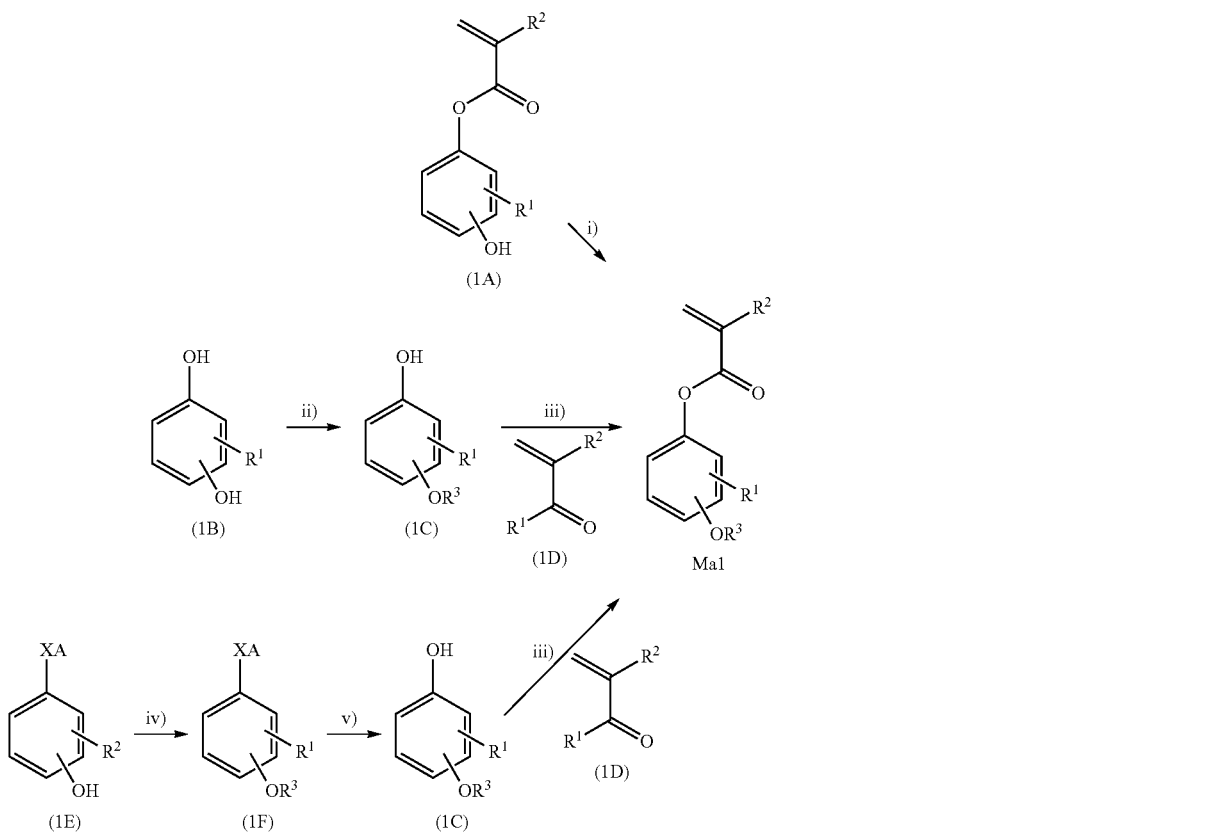

In the scheme, $R^1$ to $R^3$ are as defined above. XA is halogen. $R^1$ is halogen or —$OR^{15}$ wherein $R^{15}$ is hydrogen, methyl, ethyl or a group having the formula (1G):

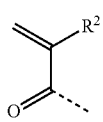

(1G)

wherein R² is as defined above.

Step iii) is reaction of intermediate phenol compound (1C) with an esterifying agent (1D) to form the desired monomer Ma1. The reaction of step iii) readily takes place under well-known conditions. The esterifying agent (1D) is preferably an acid chloride (of formula (1D) wherein $R^1$ is chlorine) or a carboxylic acid (of formula (1D) wherein $R^1$ is hydroxyl). When an acid chloride, typically carboxylic acid chloride such as acrylic acid chloride or methacrylic acid chloride is used as esterifying agent (1D), the reaction may be conducted in a solventless system or in a solvent (e.g., methylene chloride, toluene, hexane, diethyl ether, tetrahydrofuran or acetonitrile) by adding intermediate phenol compound (1C), acid chloride, and a base (e.g., triethylamine, pyridine or 4-dimethylaminopyridine) in sequence or at the same time, and optional cooling or heating. When a carboxylic acid, typically carboxylic acid such as acrylic acid or methacrylic acid is used as esterifying agent (1D), the reaction may be conducted by adding intermediate phenol compound (1C) and carboxylic acid to a solvent (e.g., toluene or hexane), heating the system in the presence of an acid catalyst, and optionally removing water (formed by reaction) out of the system. Examples of the acid catalyst used herein include mineral acids such as hydrochloric acid, sulfuric acid, nitric acid and perchioric acid and organic acids such as p-toluenesulfonic acid and benzenesulfonic acid.

Step iv) is to convert a halogenated phenol compound (1E) to an intermediate halogenated aryl compound (1F) by protection. The reaction may be performed as in step i).

Step v) is to convert halogenated aryl compound (1F) to intermediate phenol compound (1C) by oxidation. This reaction may be readily performed by any well-known procedures. One exemplary reaction procedure is shown below.

in which the hydrogen atom is substituted by an acid labile group, as represented by the general formula (5).

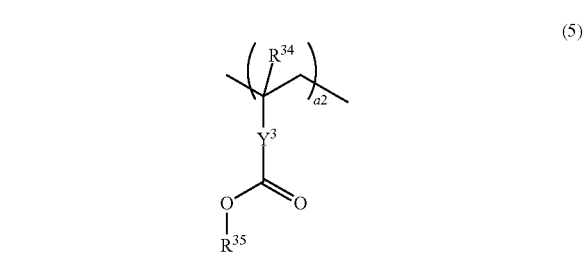

Herein $R^{34}$ is hydrogen or methyl, $R^{35}$ is an acid labile group, $Y^3$ is a single bond, a divalent $C_1$-$C_{12}$ linking group having an ester moiety, ether moiety or lactone ring, phenylene group or naphthylene group, and a2 is a number in the range: $0 \leq a2 < 1.0$.

Examples of the monomer Ma2 from which recurring units (a2) are derived are shown below.

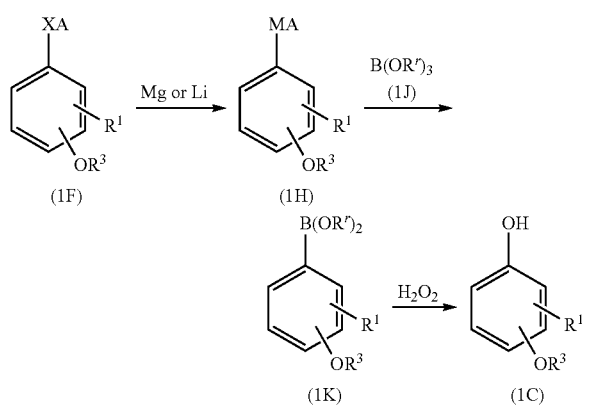

Herein $R^1$, $R^3$ and XA are as defined above; MA is Li, MgCl, MgBr or MgI; $R^r$ is a straight, branched or cyclic $C_1$-$C_6$ monovalent hydrocarbon group.

First, halogenated aryl compound (1F) is combined with Li or Mg in a solvent such as tetrahydrofuran or diethyl ether to form an organometallic reagent (1H). Then organometallic reagent (1H) is reacted with a boric acid ester (1J) to form an aryl borate derivative (1K). Finally, using an oxidizing agent such as hydrogen peroxide, performic acid, peracetic acid or m-chloroperbenzoic acid, aryl borate derivative (1K) is converted to intermediate phenol compound (1C). Typically these steps may be consecutively performed in one pot without intervening purifying steps.

In the positive resist composition, the recurring unit (a1) is methacrylate having both an acyl or alkoxycarbonyl group and an acid labile group-substituted phenolic hydroxyl group, each one per molecule. Since the acyl or alkoxycarbonyl group is an electron attractive group, the hydroxyl group resumed after deprotection has a high acidity, which provides a high alkaline dissolution rate and a high dissolution contrast, improving focus margin and other factors.

While the polymer is characterized by comprising recurring units (a1) of phenyl methacrylate having an acid labile group and an acyl or alkoxycarbonyl group which is electron attractive, as represented by formula (1), it may have further copolymerized recurring units (a2) having a carboxyl group

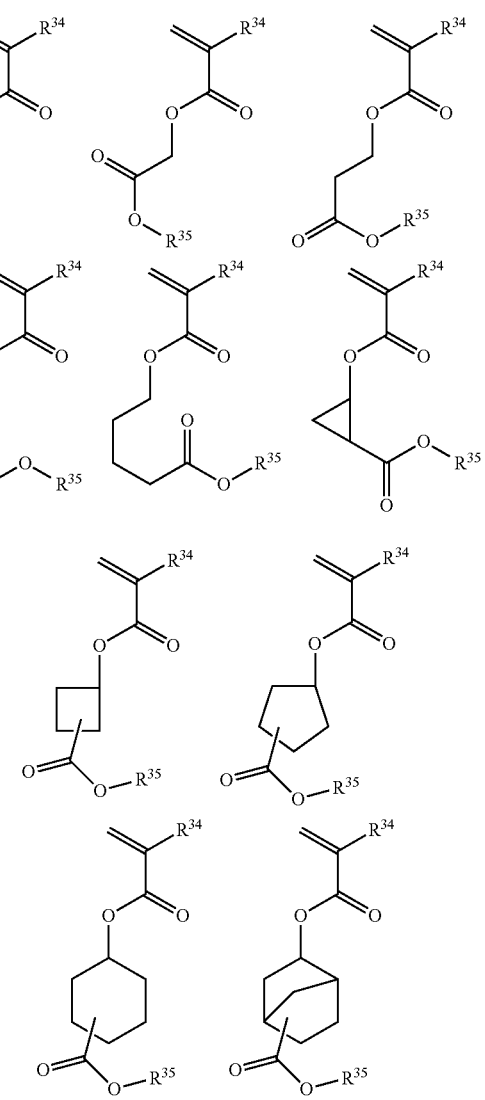

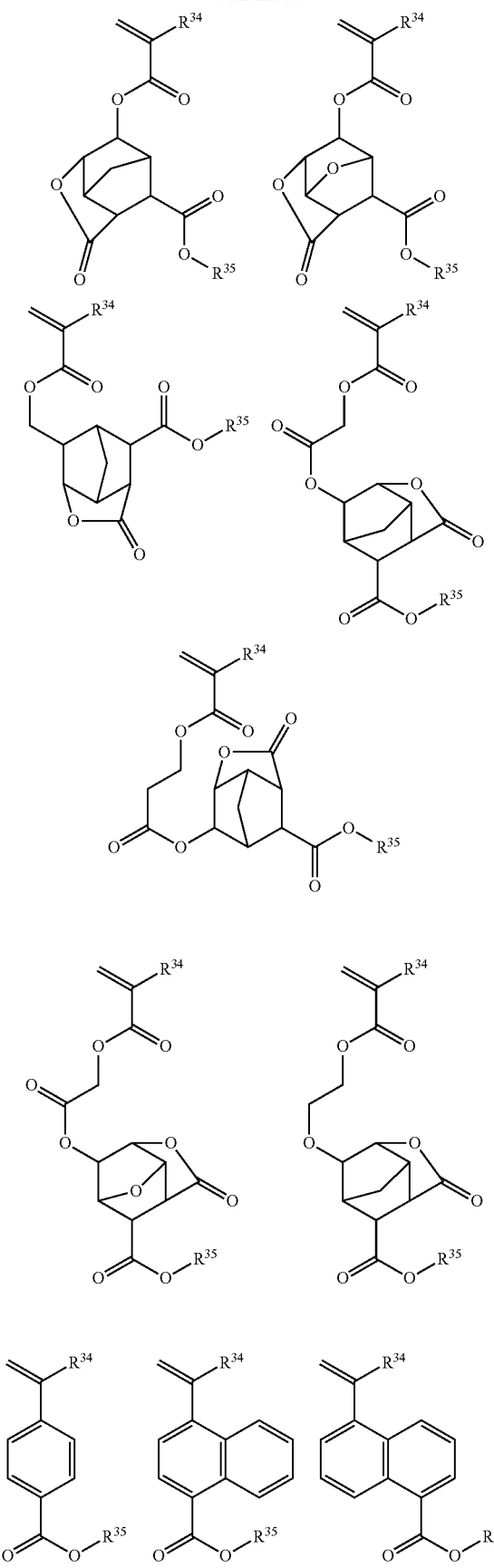

-continued

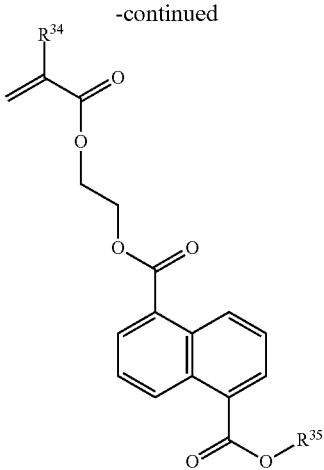

Herein $R^{34}$ and $R^{35}$ are as defined above.

The acid labile group represented by $R^{35}$ may be selected from those described in US 20150064626 (JP-A 2015-049465, paragraphs [0032]-[0084]). The acid labile groups preferably include groups of the formulae (A-1) to (A-3).

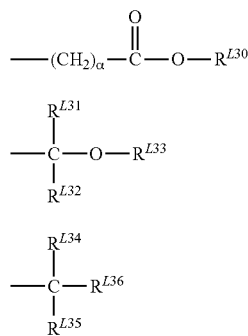

(A-1)

(A-2)

(A-3)

In formula (A-1), $R^{L30}$ is a $C_4$-$C_{20}$, preferably $C_4$-$C_{15}$, tertiary alkyl group, trialkylsilyl group having $C_1$-$C_6$ alkyl, $C_4$-$C_{20}$ oxoalkyl group, or a group of formula (A-3), and α is an integer of 0 to 6.

In formula (A-2), $R^{L31}$ and $R^{L32}$ each are hydrogen or a $C_1$-$C_{18}$, preferably $C_1$-$C_{10}$, straight, branched or cyclic alkyl group. $R^{L33}$ is a $C_1$-$C_{18}$, preferably $C_1$-$C_{10}$, monovalent hydrocarbon group which may contain a heteroatom such as oxygen, examples of which include straight, branched or cyclic alkyl groups and substituted forms of such alkyl groups in which at least one hydrogen atom is substituted by hydroxyl, alkoxy, oxo, amino, alkylamino or the like. A pair of $R^{L31}$ and $R^{L32}$, $R^{L31}$ and $R^{L33}$, or $R^{L32}$ and $R^{L33}$ may bond together to form a ring with the carbon atom to which they are attached. Ring-forming participants of $R^{L31}$, $R^{L32}$ and $R^{L33}$ represent a $C_1$-$C_{18}$, preferably $C_1$-$C_{10}$, straight or branched alkylene group, while the ring preferably has 3 to 10 carbon atoms, more preferably 4 to 10 carbon atoms.

In formula (A-3), $R^{L34}$, $R^{L35}$ and $R^{L36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ alicyclic ring with the carbon atom to which they are attached.

In addition to the recurring units (a1) of formula (1) and optional recurring units (a2) having a carboxyl group substituted with an acid labile group, preferably the polymer may have further copolymerized therein recurring units (b) having an adhesive group. The adhesive group is selected from among hydroxyl, carboxyl, lactone ring, carbonate, thiocarbonate, carbonyl, cyclic acetal, ether, ester, is sulfonic acid ester, cyano, amide, and —O—C(=O)-G- wherein G is sulfur or NH. The (co)polymer should have a weight average molecular weight of 1,000 to 500,000.

Preferably the recurring units (b) are units having a phenolic hydroxyl group. More preferably the recurring units (b) are selected from recurring units (b1) to (b8) represented by the general formula (2).

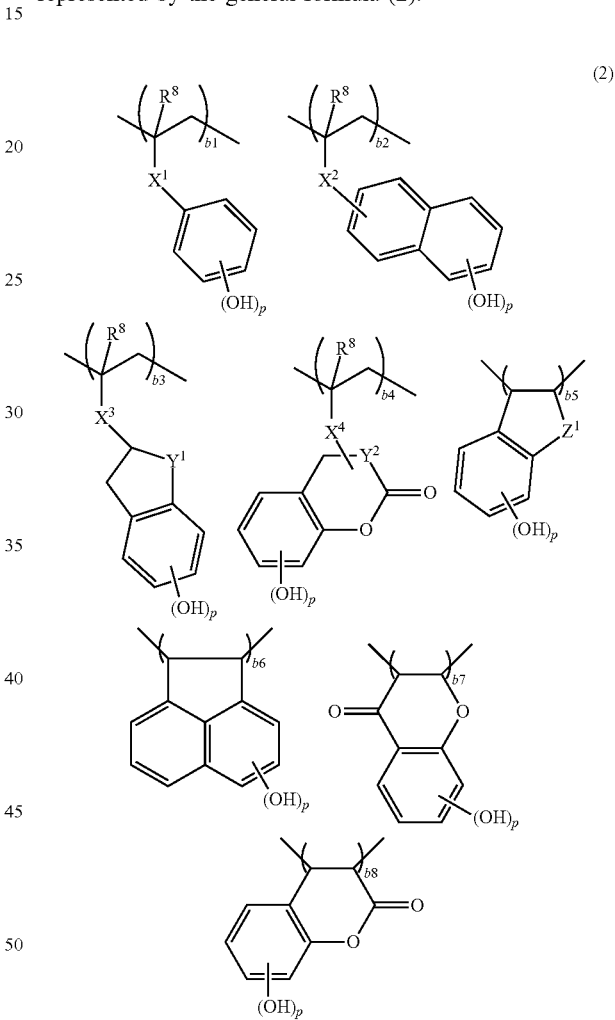

(2)

Herein $R^8$ is hydrogen or methyl. $X^1$ and $X^2$ each are a single bond or a group: —C(=O)—O—$R^9$—. $X^3$ and $X^4$ each are a group: —C(=O)—O—$R^9$—. $R^9$ is a single bond or a straight, branched or cyclic $C_1$-$C_{10}$ alkylene group. $Y^1$ and $Y^2$ each are methylene or ethylene. $Z^1$ is methylene, oxygen atom or sulfur atom, p is 1 or 2, b1 to b8 are numbers in the range: $0 \leq b1 < 1.0$, $0 \leq b2 < 1.0$, $0 \leq b3 < 1.0$, $0 \leq b4 < 1.0$, $0 \leq b5 < 1.0$, $0 \leq b6 < 1.0$, $0 \leq b7 < 1.0$, and $0 \leq b8 < 1.0$. When any one or more of recurring units (b1) to (b8) are copolymerized, one or more b's are positive numbers satisfying $0 < b1+b2+b3+b4+b5+b6+b7+b8 < 1.0$.

Examples of the monomer from which the recurring units (b) having an adhesive group are derived are shown below.

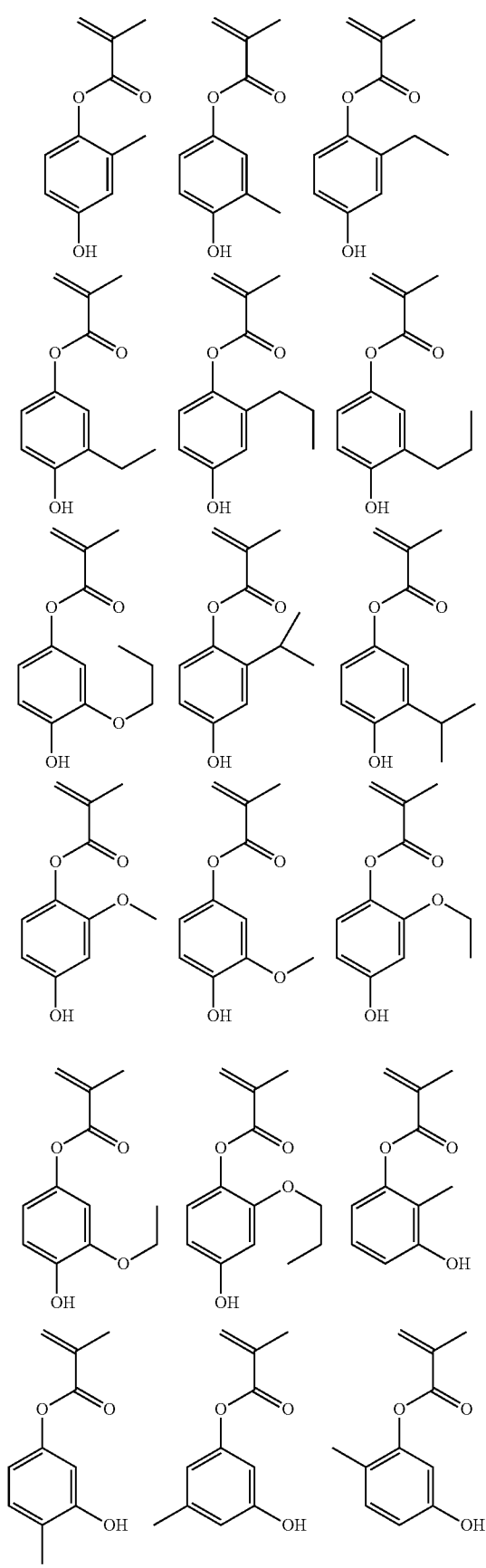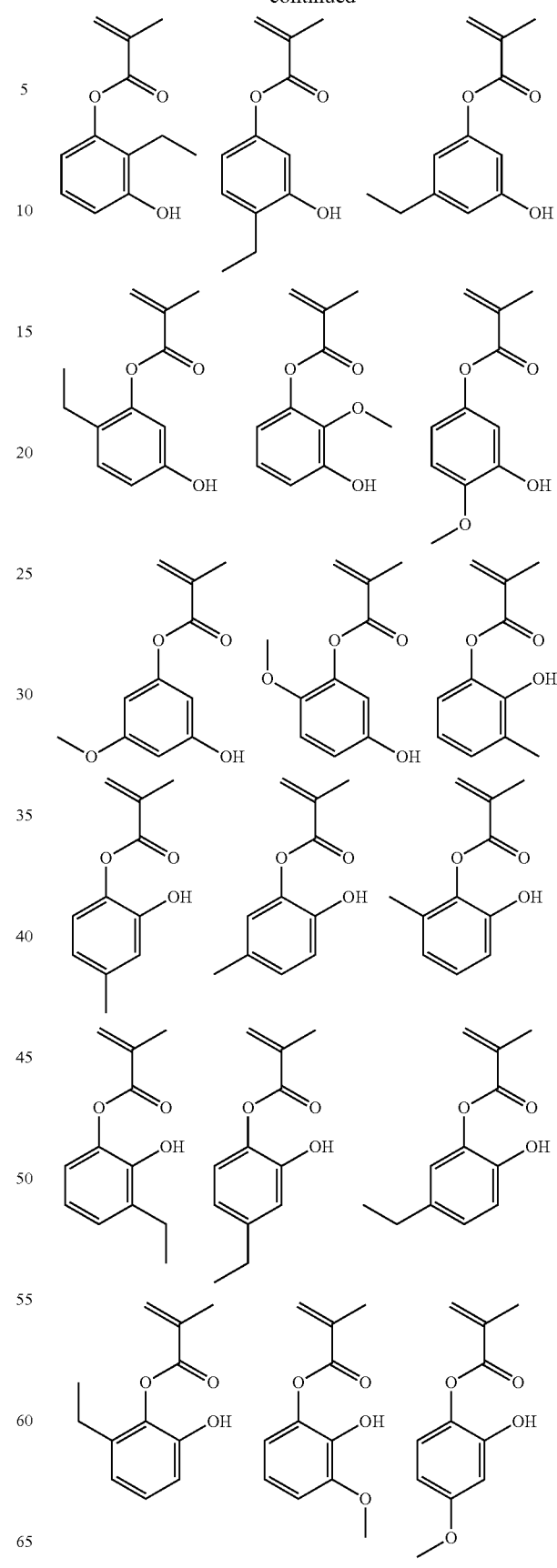

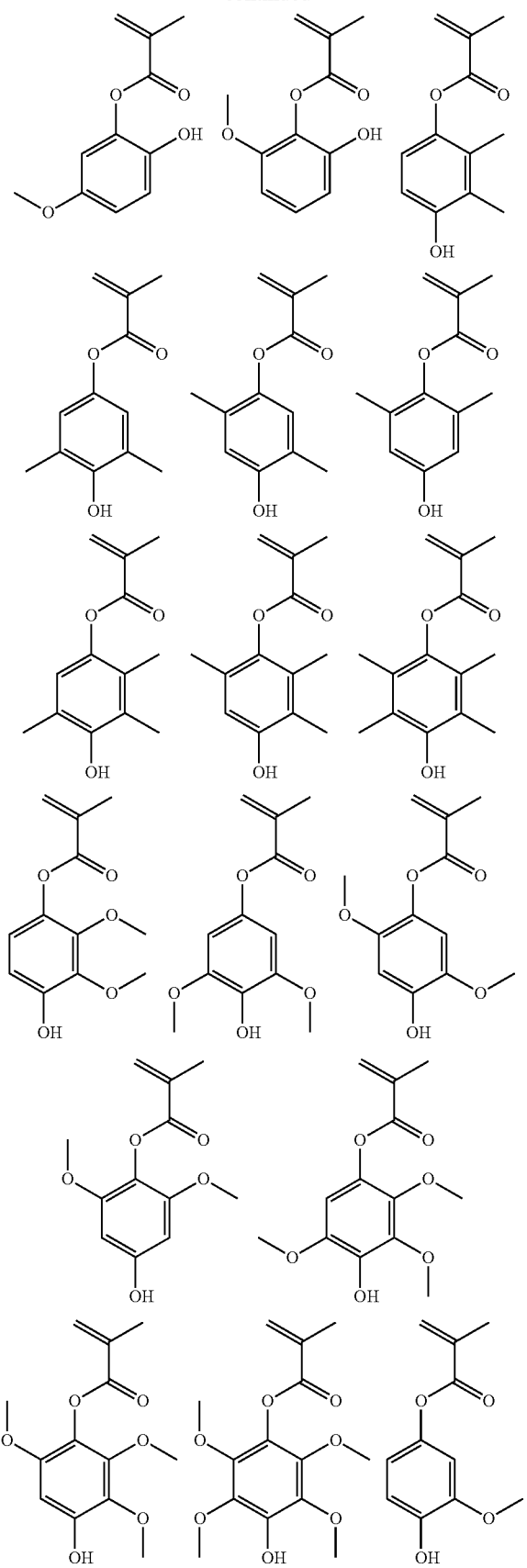
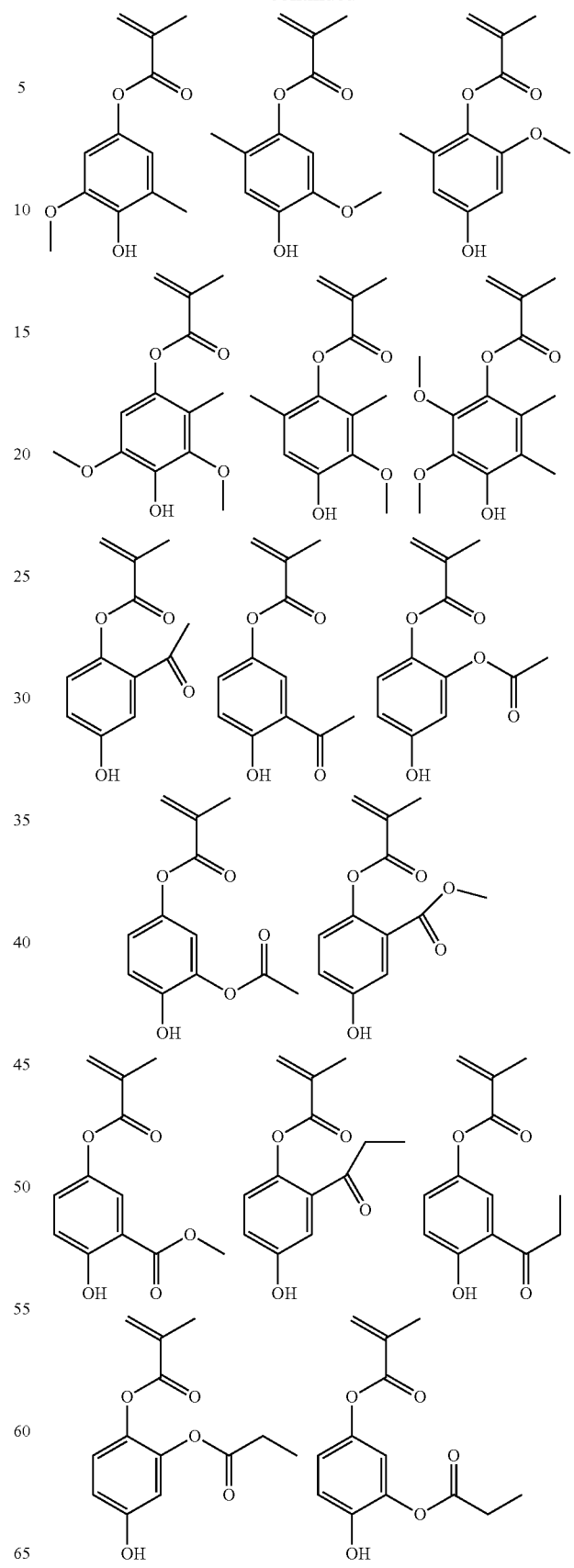

27
-continued
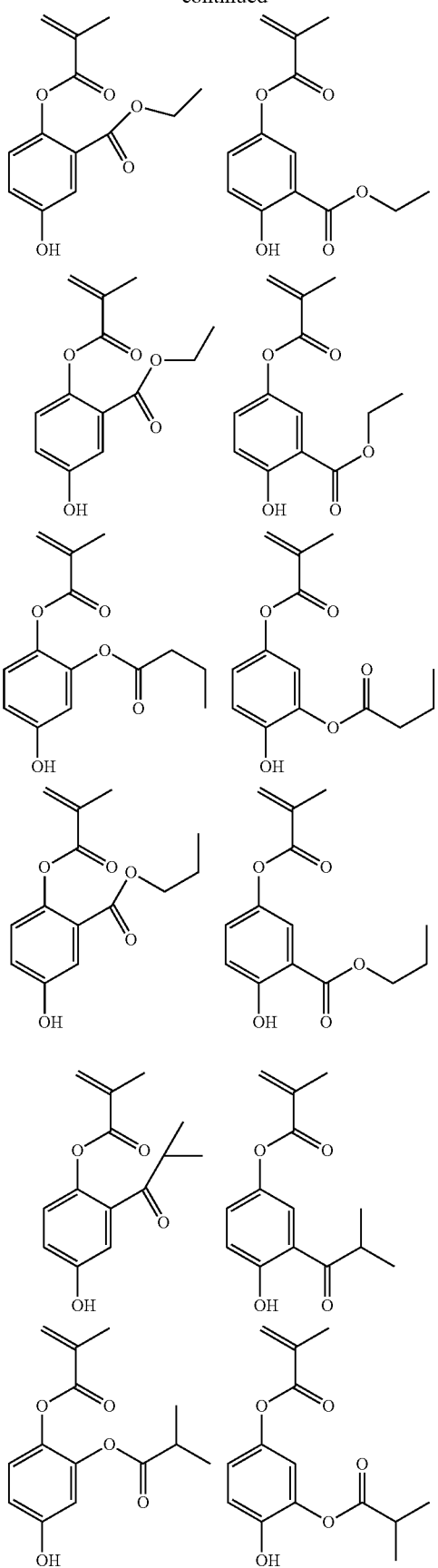
28
-continued
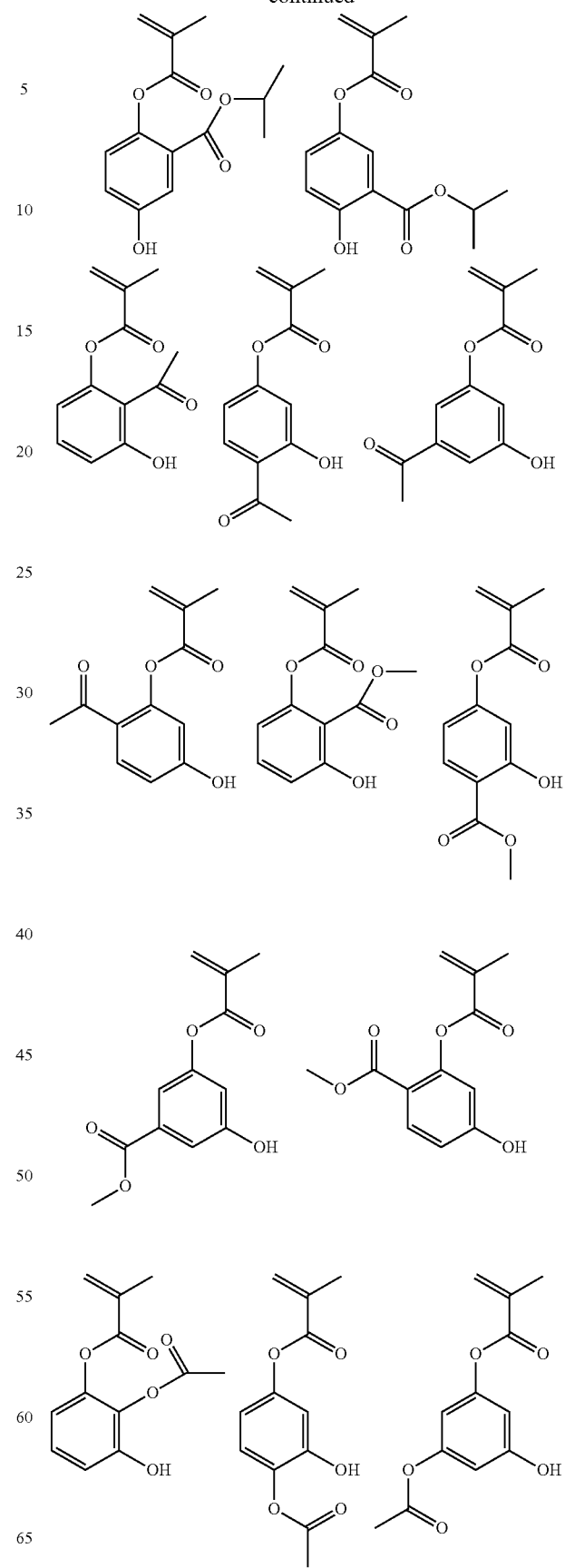

-continued
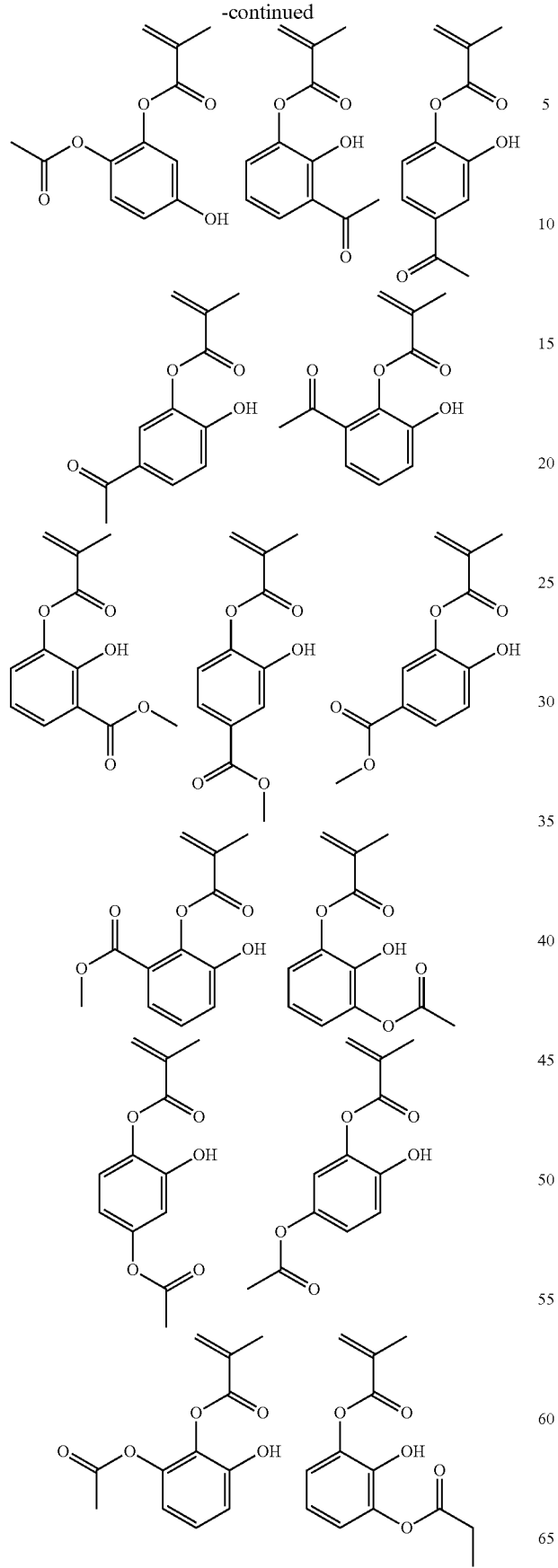
-continued
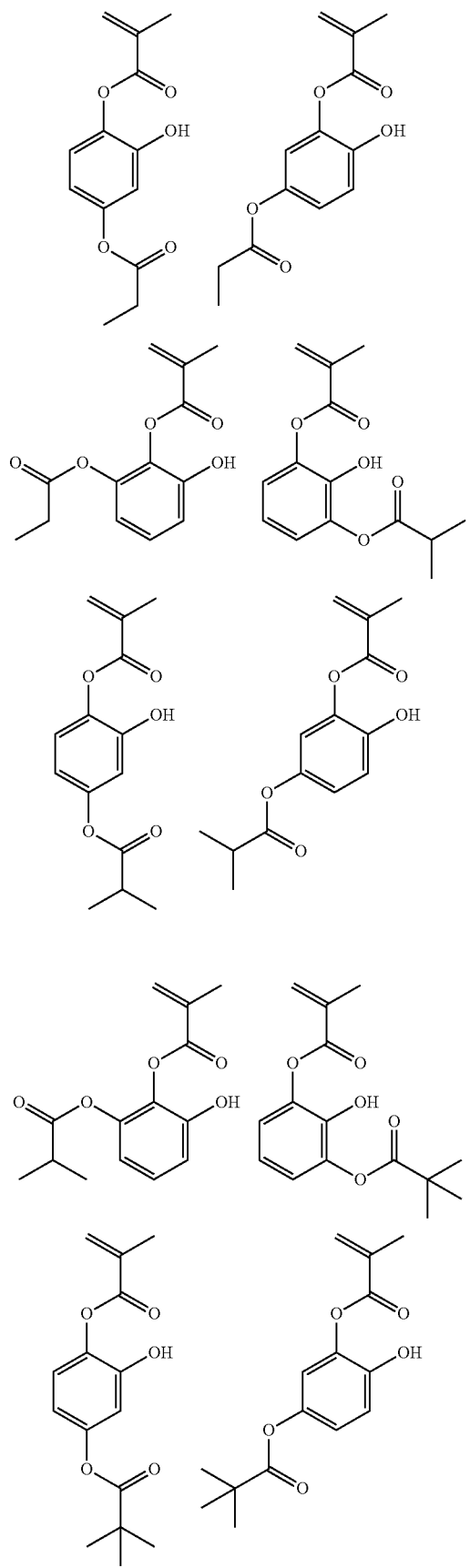

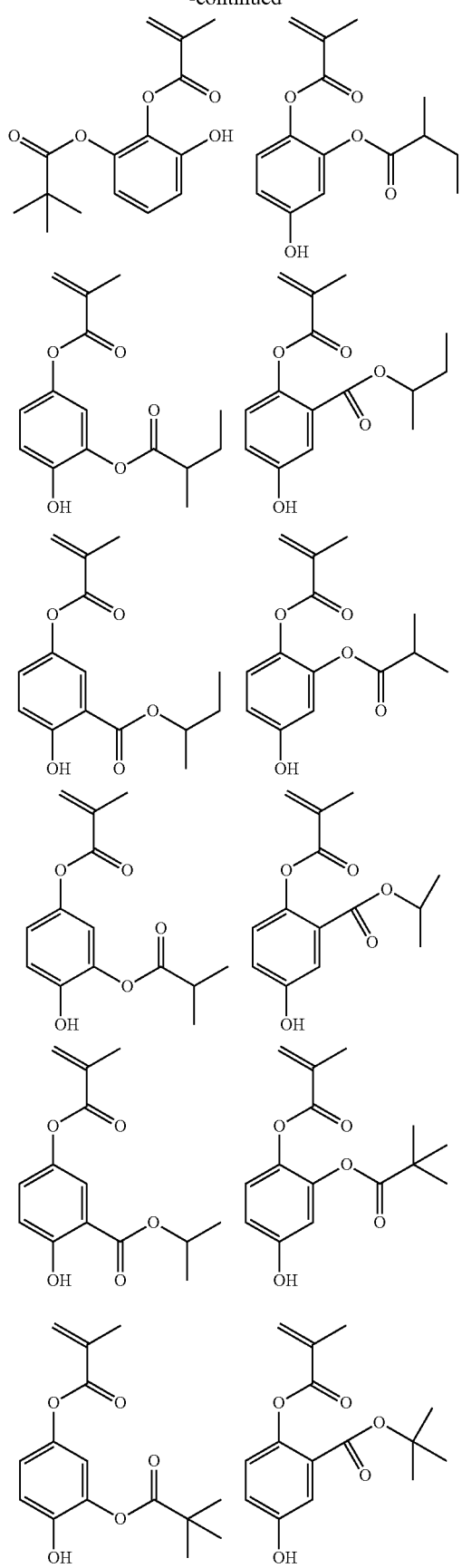
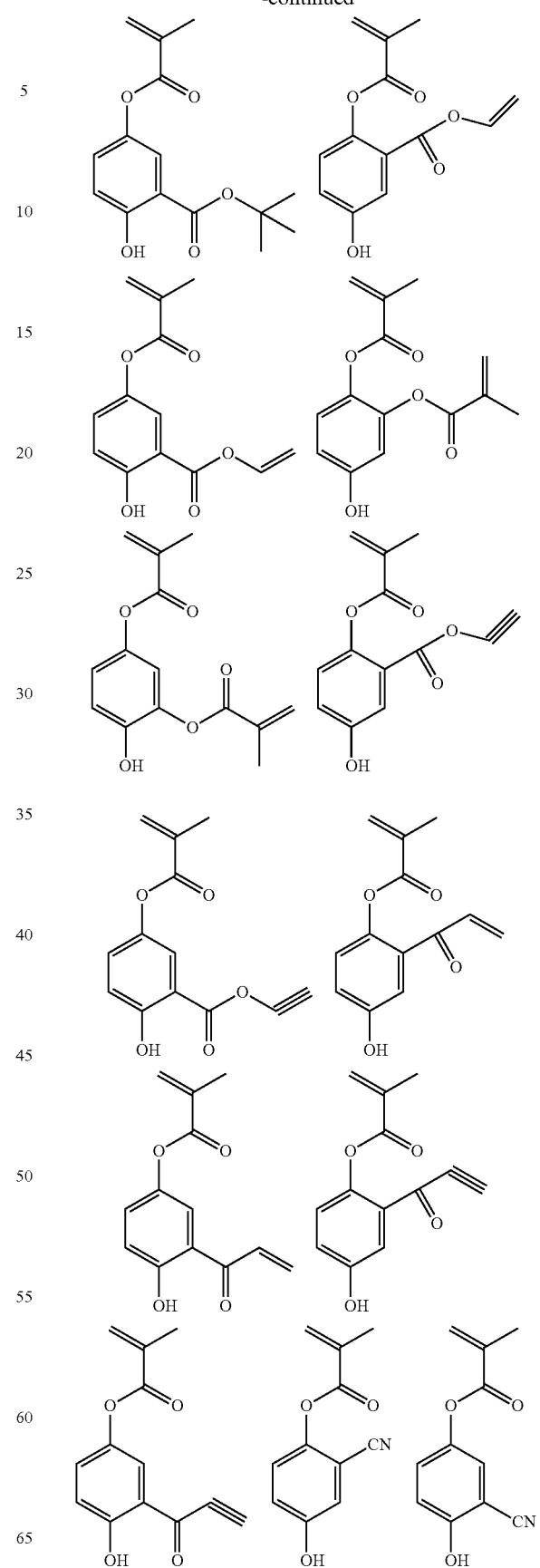

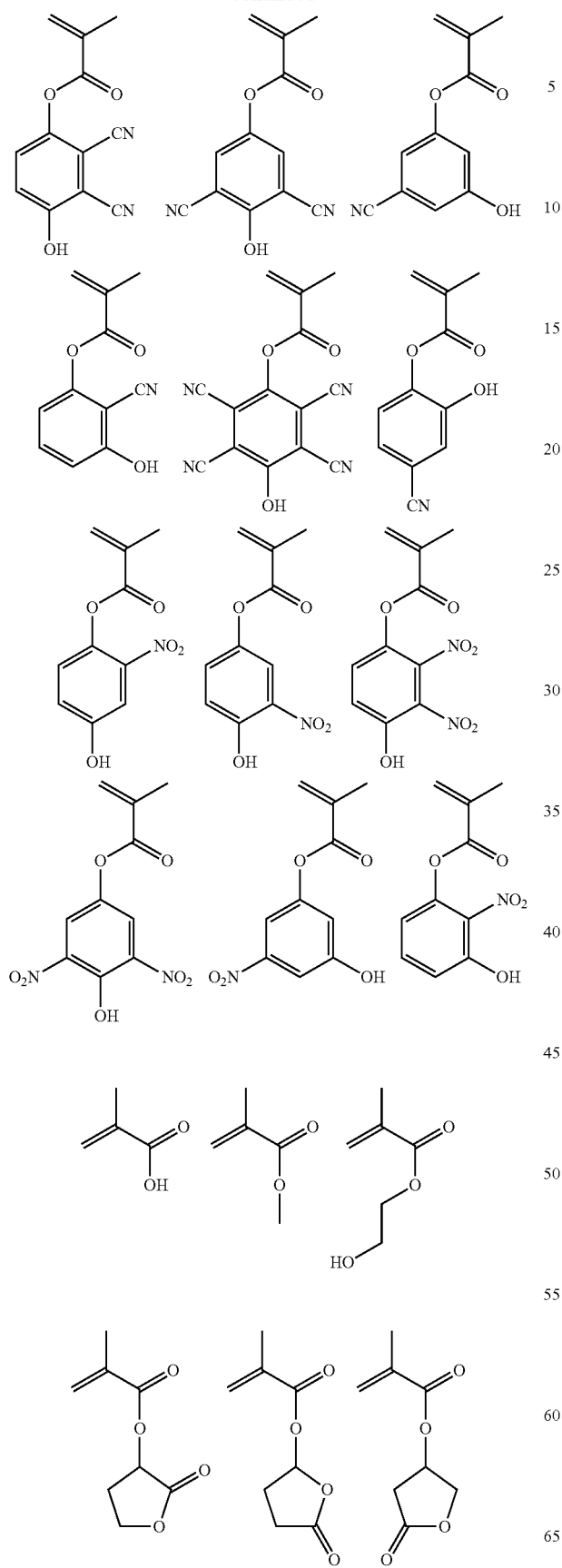
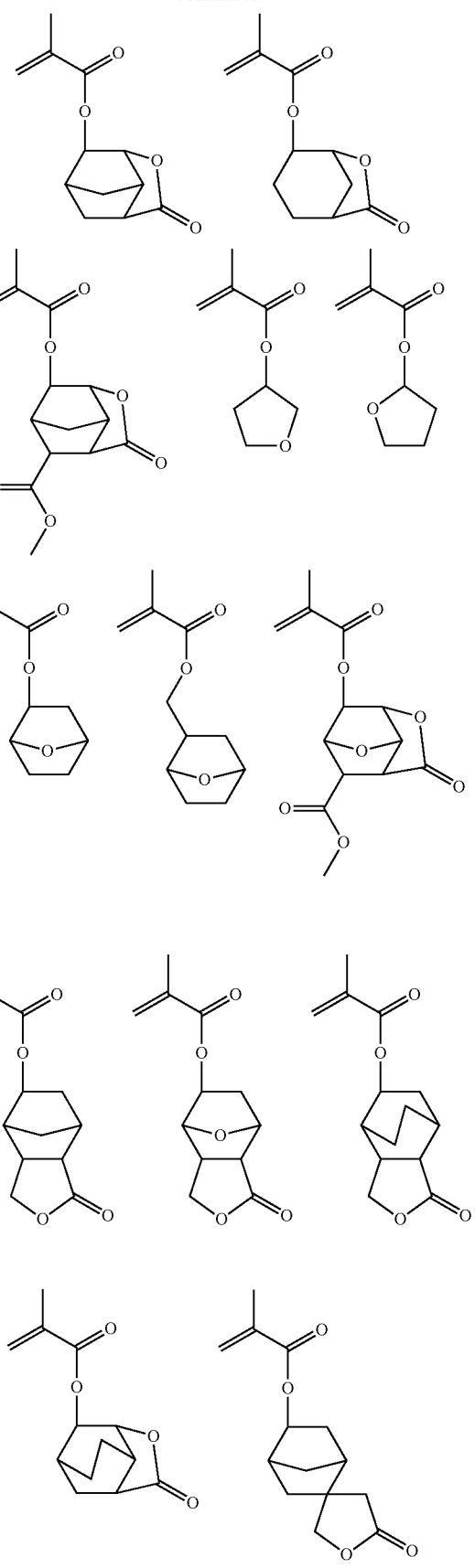

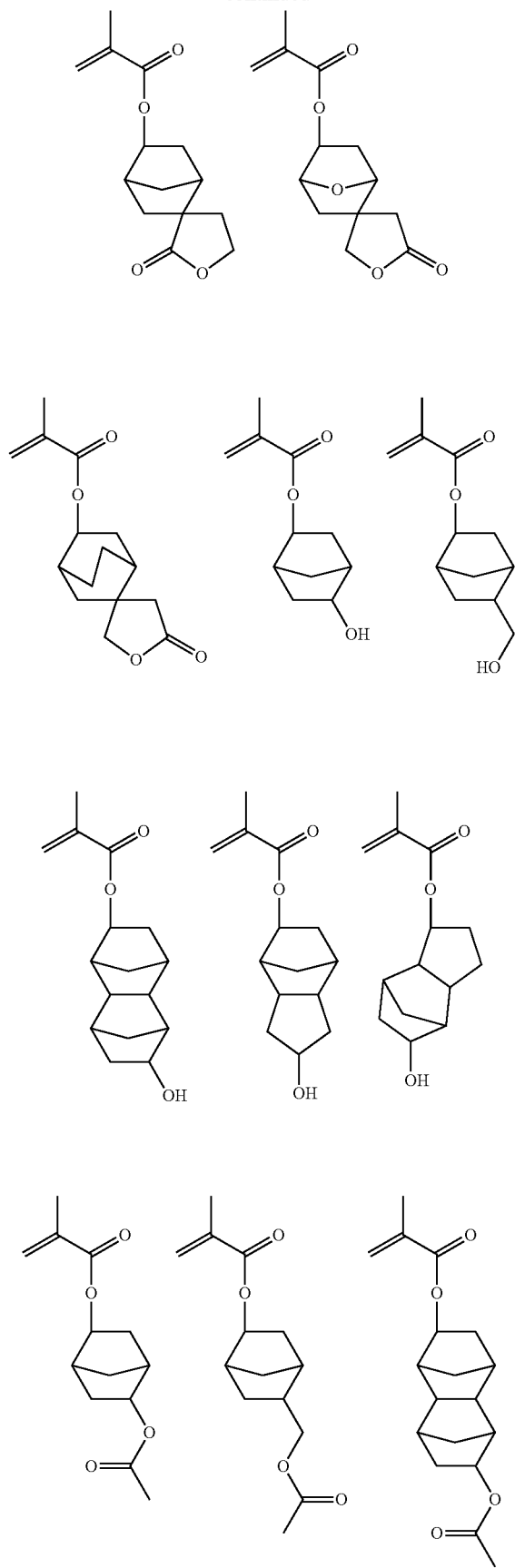
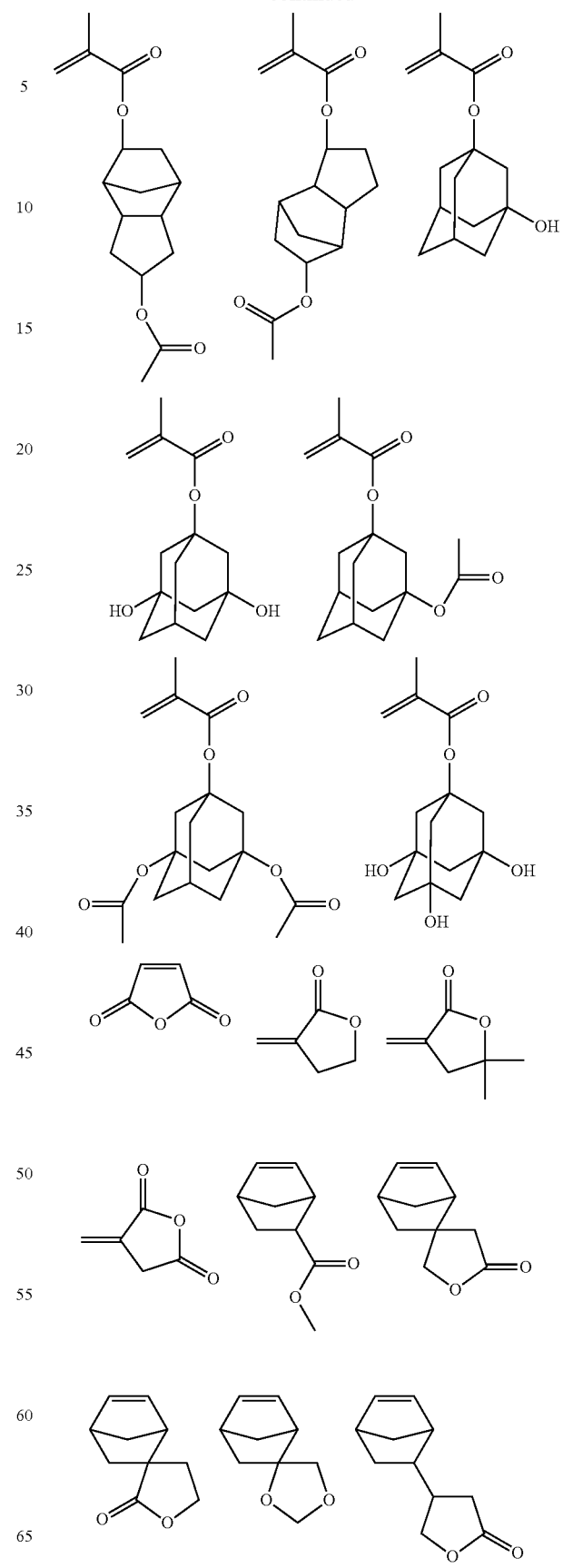

37
-continued
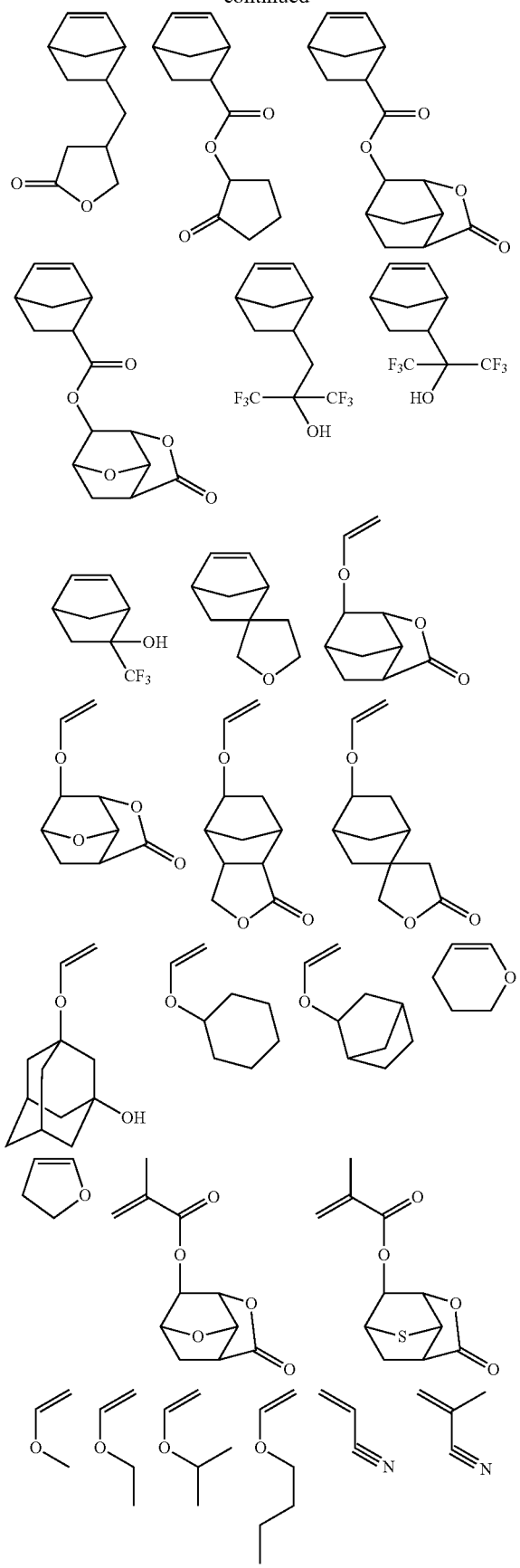
38
-continued
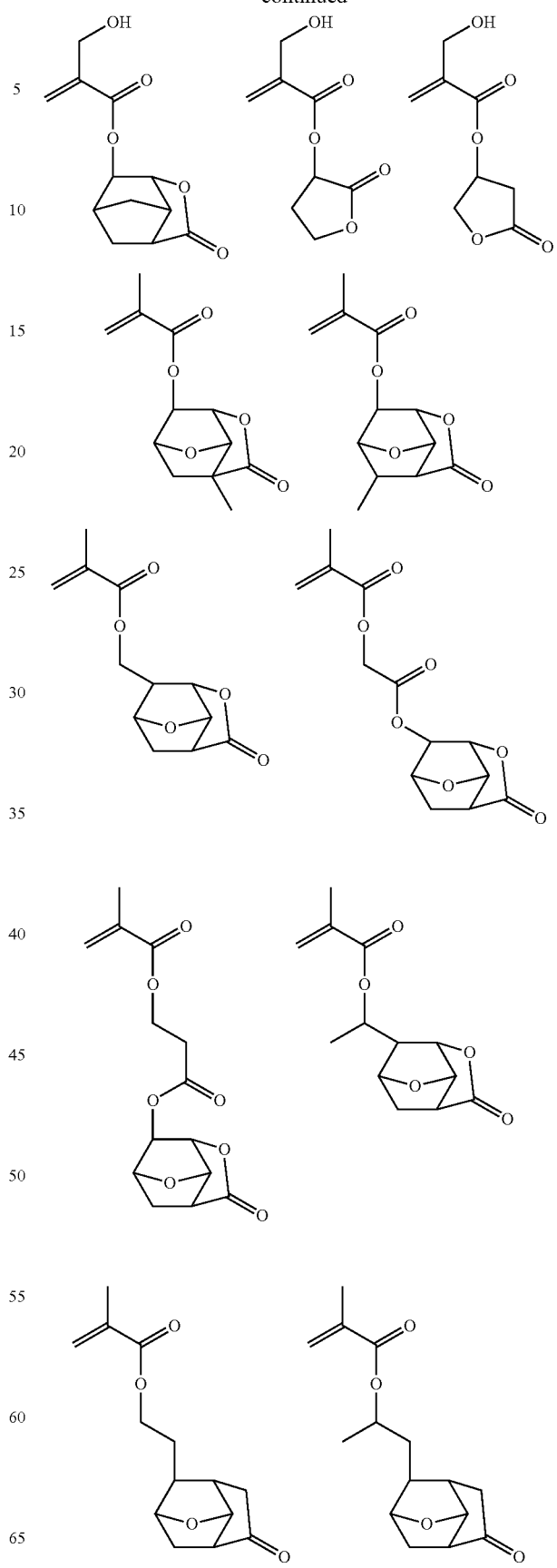

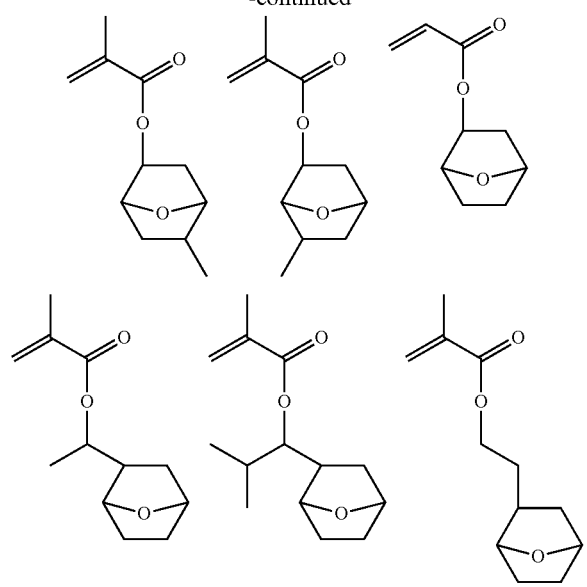
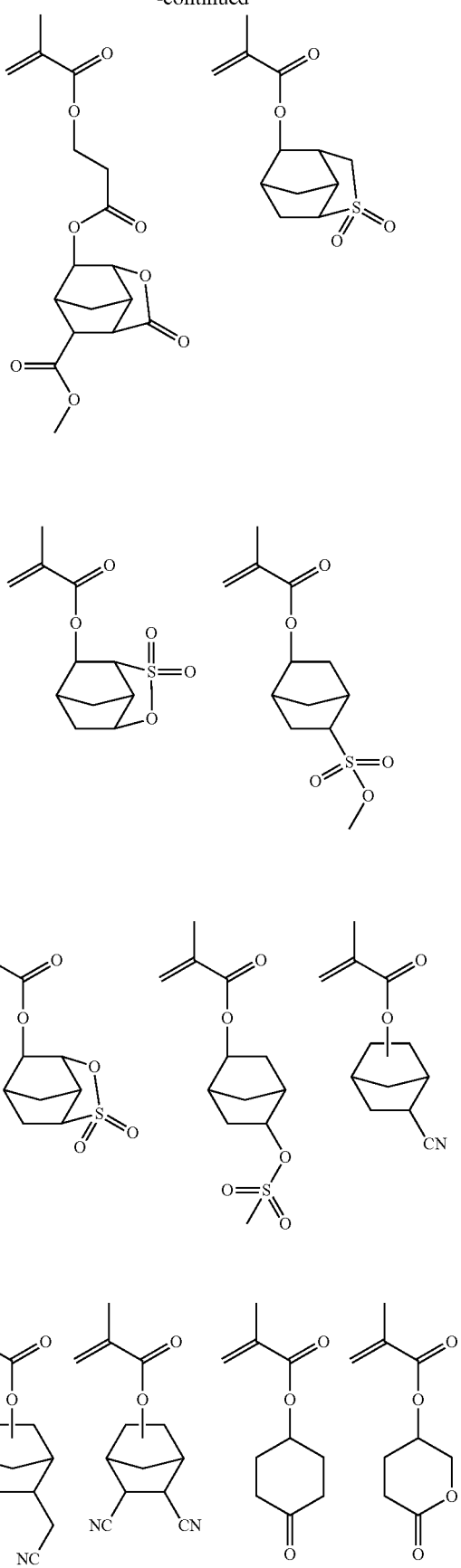

-continued
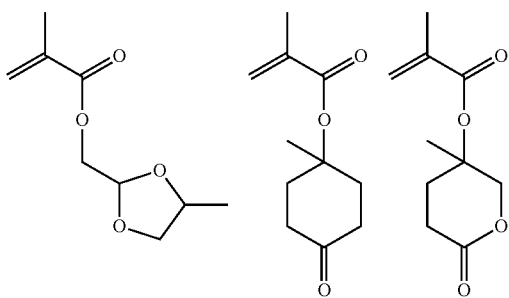
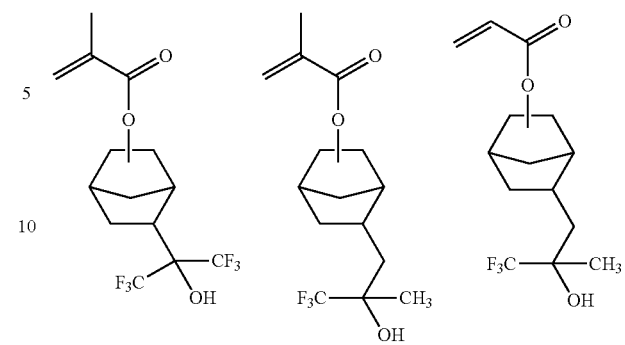
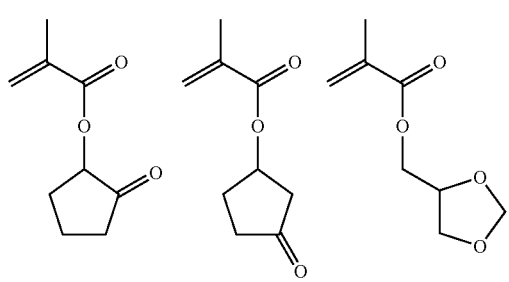
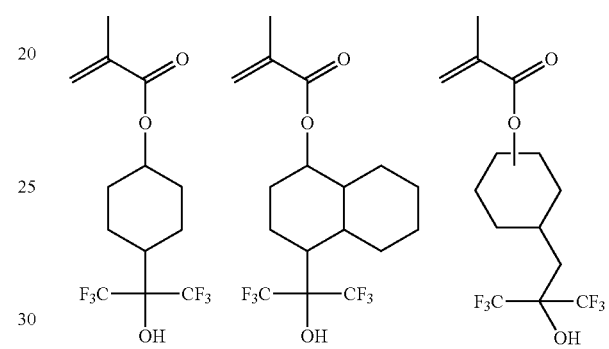
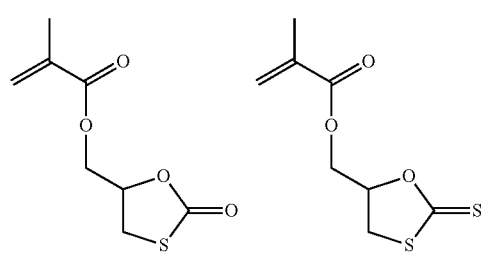
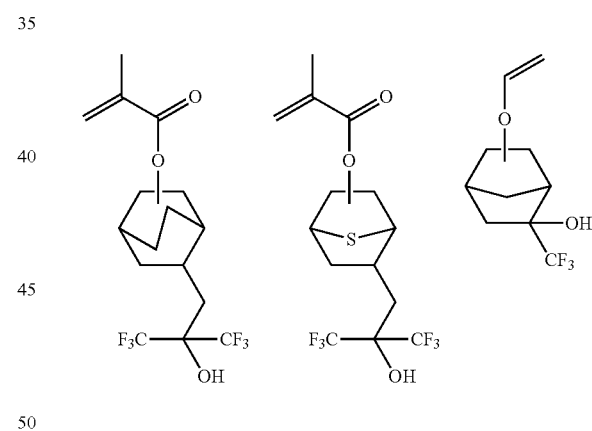
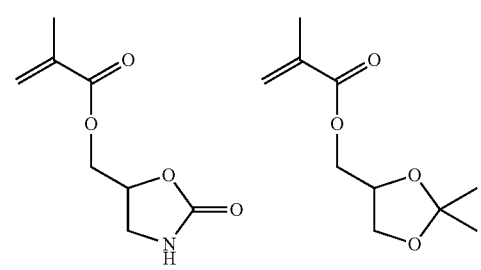
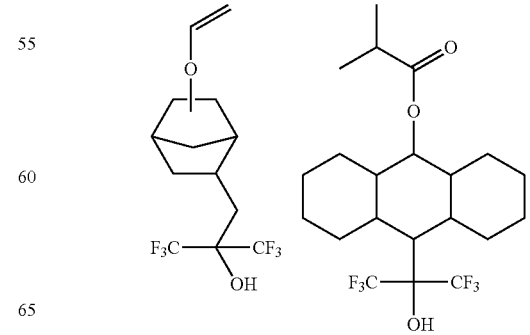

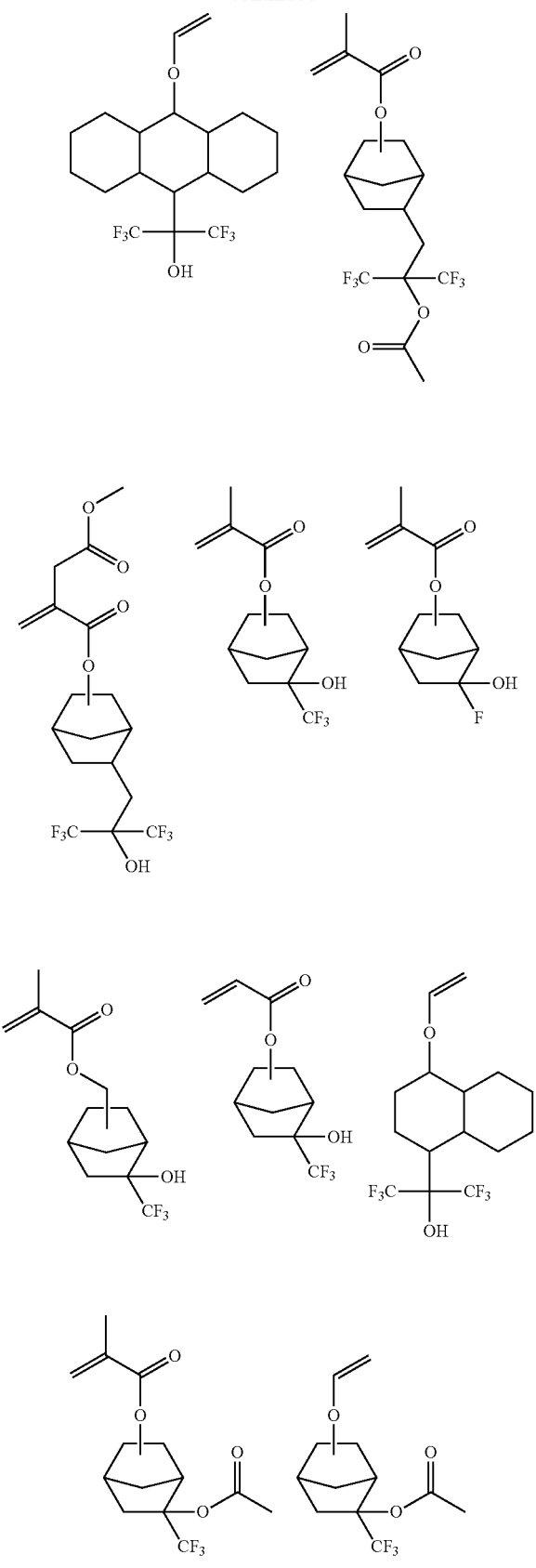
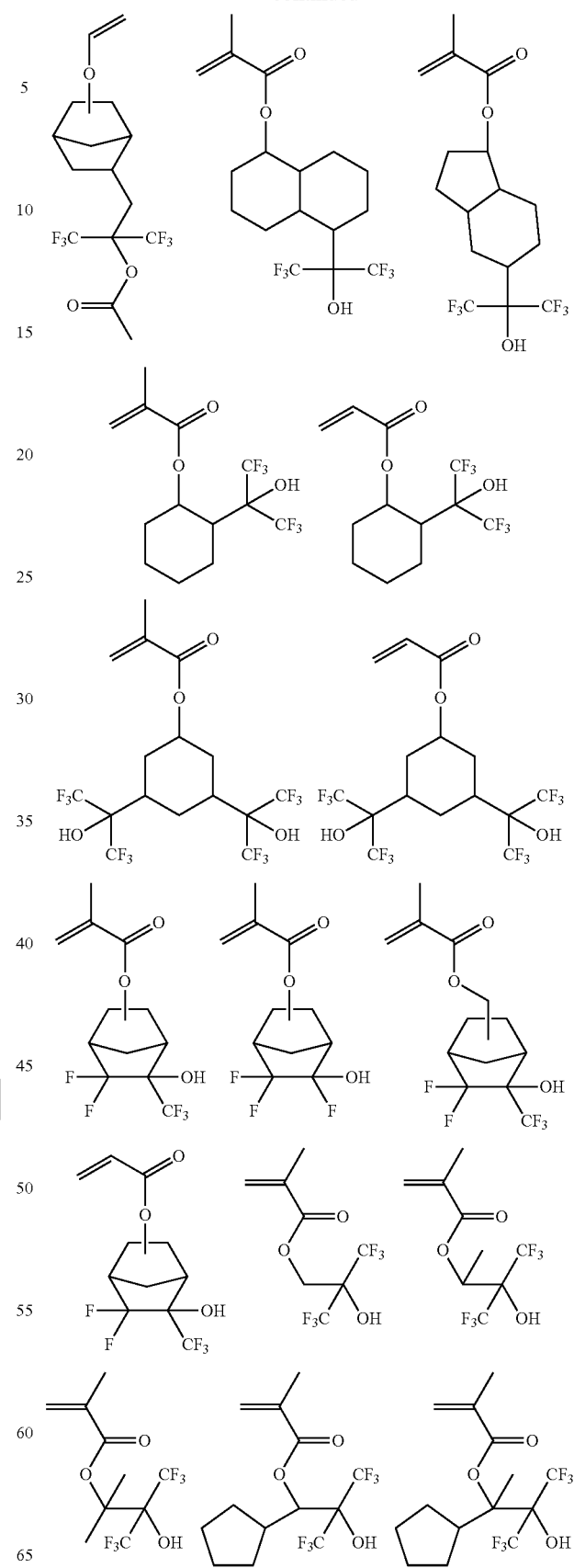

-continued
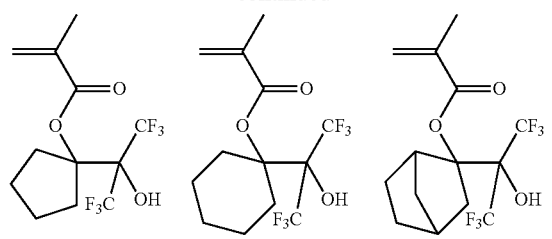
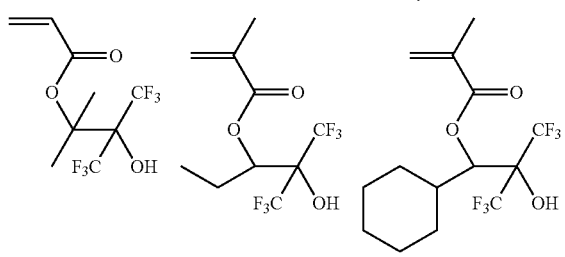
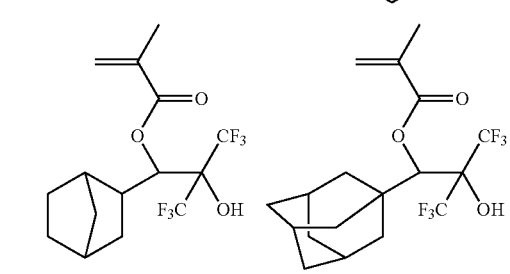
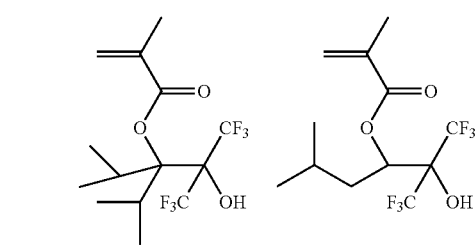
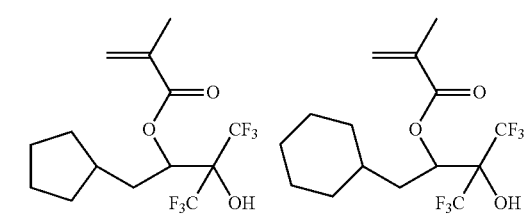
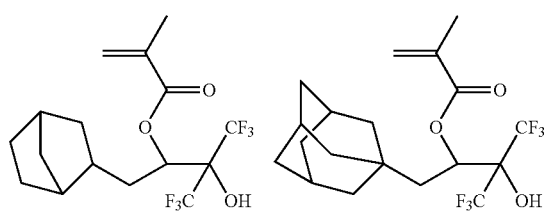
-continued
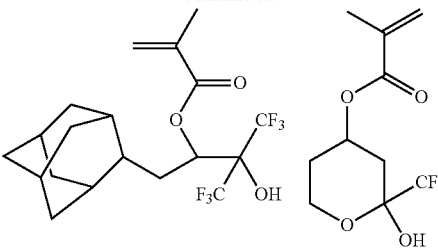
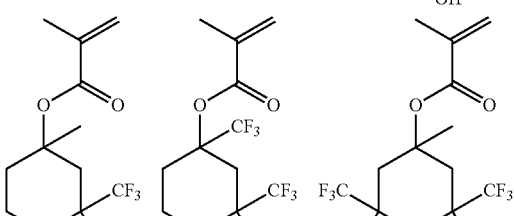
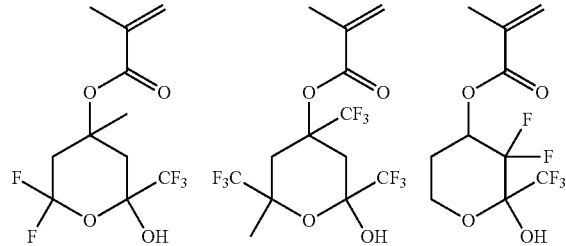
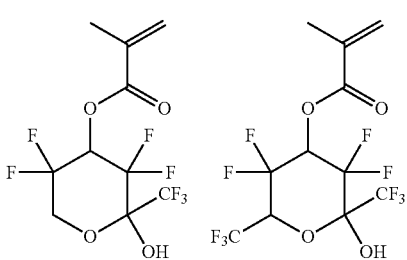
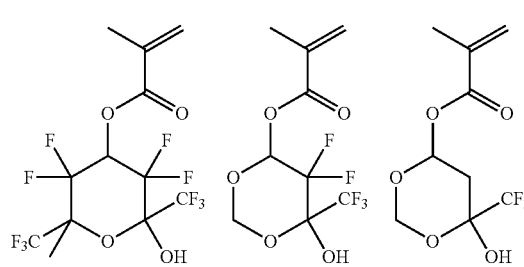
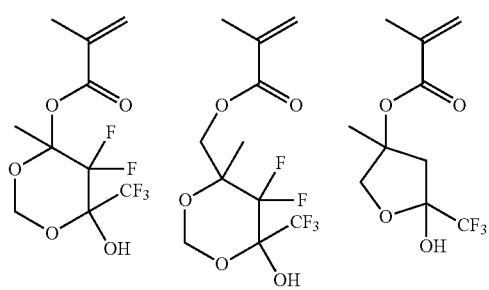

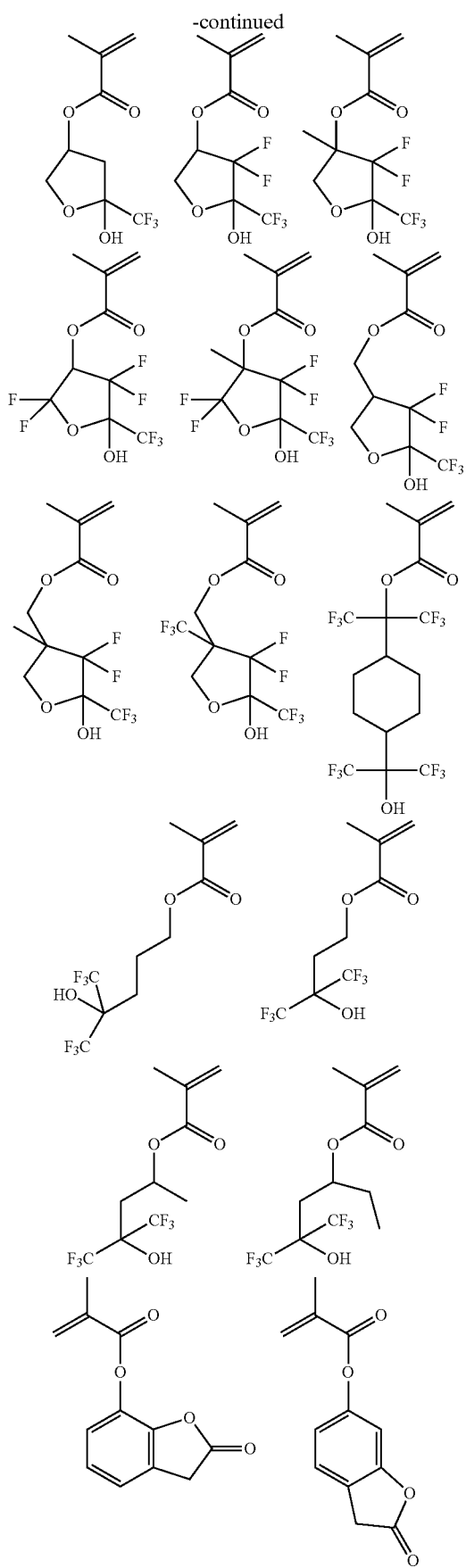
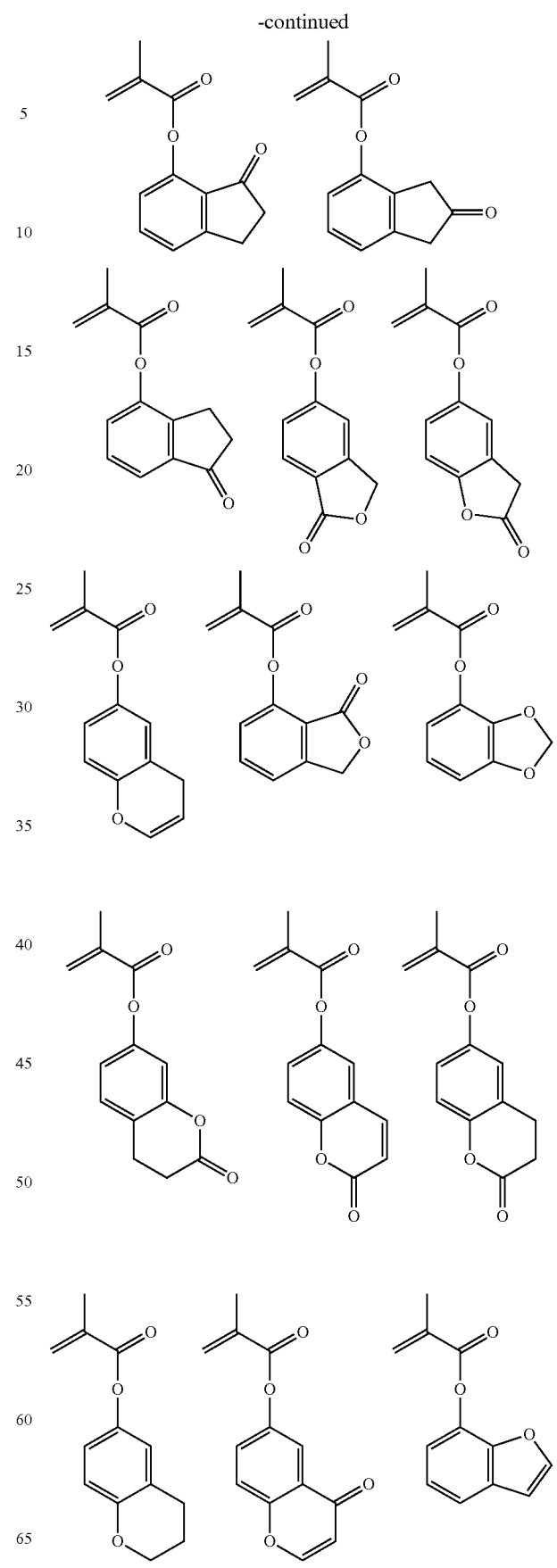

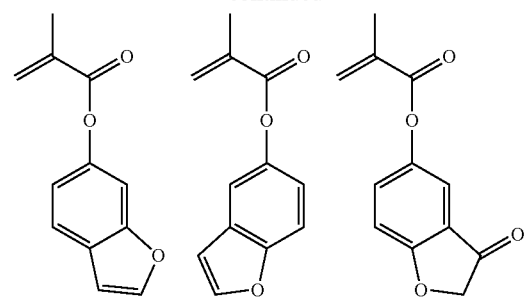
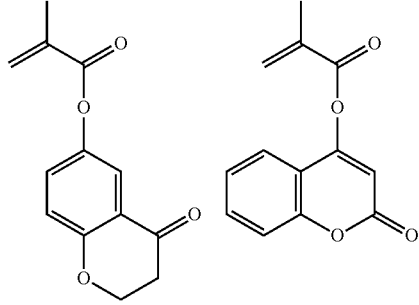
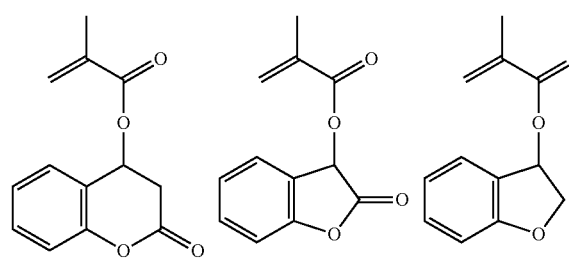
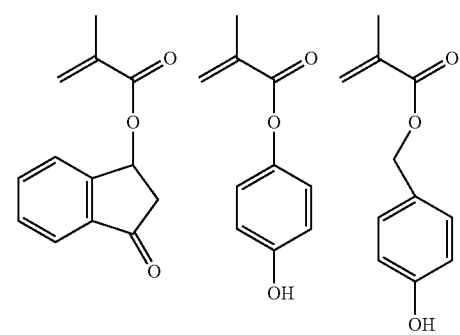
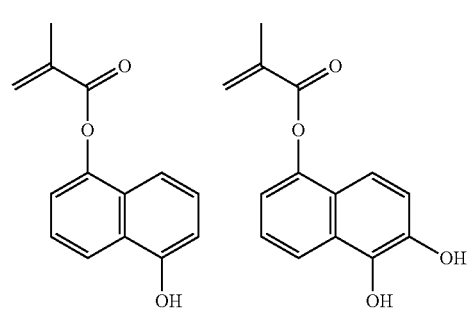
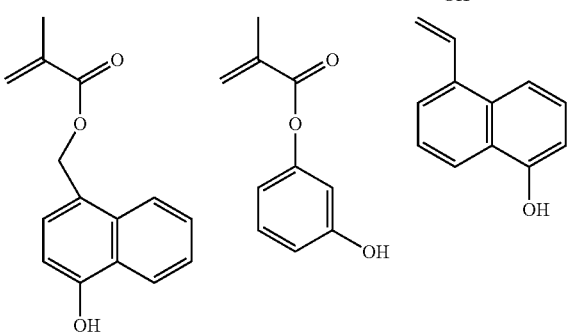
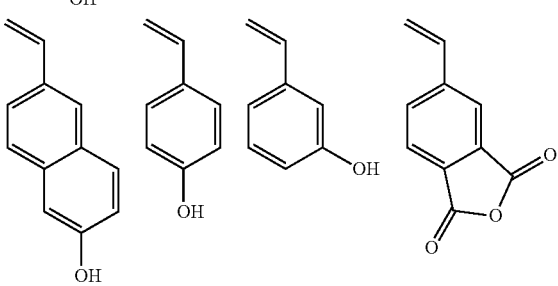
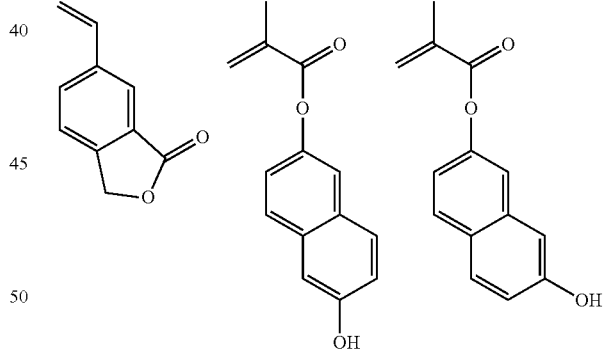
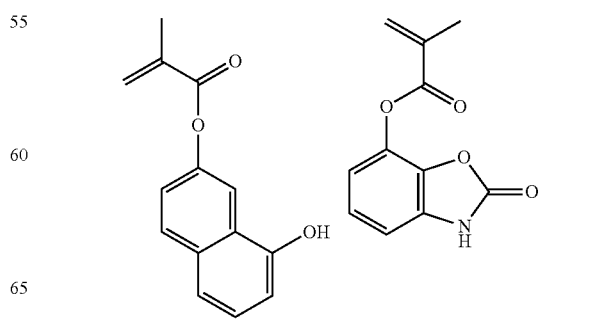

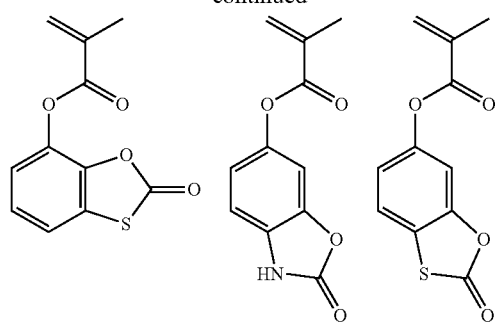
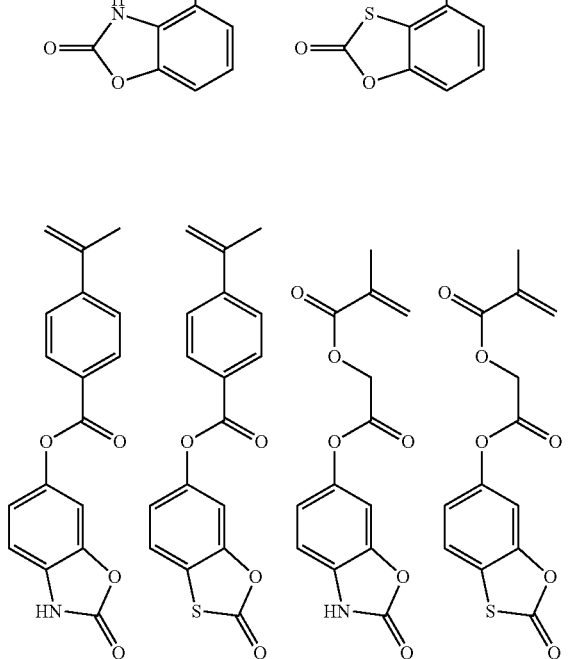
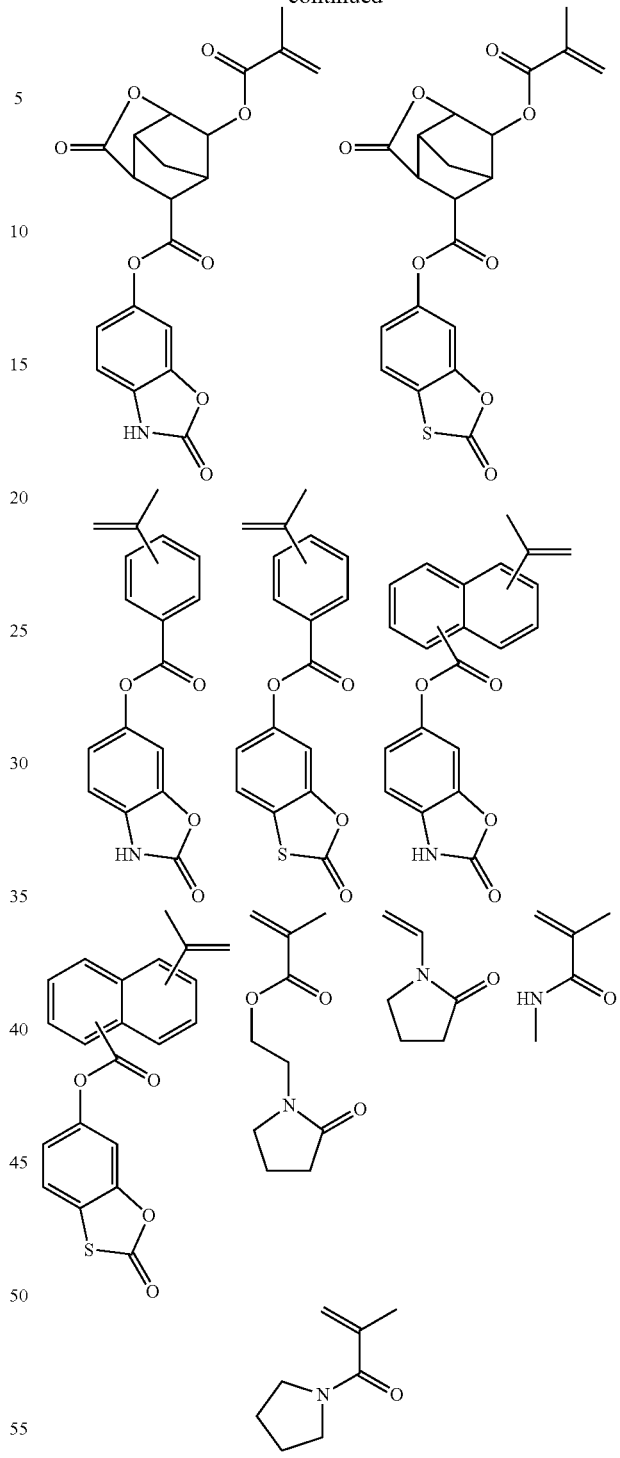

On use of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxy group may be replaced by an acetyl, formyl, pivaloyl or similar group prior to polymerization, and the polymerization be followed by alkaline hydrolysis.

The polymer may have further copolymerized therein recurring units (c) of at least one type selected from recurring units (c1) to (c5) of indene, acenaphthylene, chromone, coumarin, and norbornadiene derivatives, represented by the general formula (3).

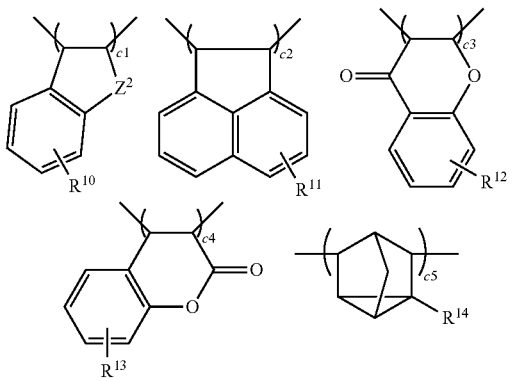

Herein $R^{10}$ to $R^{14}$ are each independently hydrogen, $C_1$-$C_{30}$ alkyl, halo-substituted $C_1$-$C_{30}$ alkyl, $C_1$-$C_8$ alkoxy, $C_1$-$C_8$ alkanoyl, $C_2$-$C_8$ alkoxycarbonyl, $C_6$-$C_{10}$ aryl, halogen, or 1,1,1,3,3,3-hexafluoro-2-propanol. $Z^2$ is methylene, oxygen atom or sulfur atom. It is noted that the term "halo-substituted alkyl" refers to an alkyl group in which one or more or even all carbon-bonded hydrogen atoms are substituted by halogen atoms. The subscripts c1 to c5 are numbers in the range: $0 \leq c1<1.0$, $0 \leq c2<1.0$, $0 \leq c3<1.0$, $0 \leq c4<1.0$, and $0 \leq c5<1.0$. When any one or more of recurring units (c1) to (c5) are copolymerized, one or more c's are positive numbers satisfying $0<c1+c2+c3+c4+c5<1.0$.

In the polymer, recurring units (d) having a sulfonium salt, typically recurring units (d1) to (d3) represented by the general formula (4) may be further copolymerized. JP-A 2006-045311 discloses sulfonium salts having polymerizable olefin capable of generating a specific sulfonic acid and similar iodonum salts. JP-A 2006-178317 discloses a sulfonium salt having sulfonic acid directly bound to the main chain.

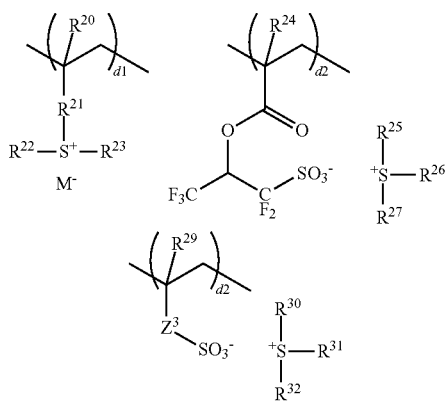

Herein $R^{20}$, $R^{24}$ and $R^{29}$ each are hydrogen or methyl. $R^{21}$ is a single bond, phenylene, —O—$R^{28}$—, or —C(=O)—$Y^4$—$R^{28}$— wherein $Y^4$ is oxygen or NH and $R^{28}$ is a straight, branched or cyclic $C_1$-$C_6$ alkylene, phenylene or alkenylene group, which may contain a carbonyl (—CO—), ester (—COO—), ether (—O—) or hydroxyl moiety. $R^{22}$, $R^{23}$, $R^{25}$, $R^{26}$, $R^{27}$, $R^{30}$, $R^{31}$, and $R^{32}$ are each independently a straight, branched or cyclic $C_1$-$C_{12}$ alkyl, $C_6$-$C_{12}$ aryl, or $C_7$-$C_{20}$ aralkyl group, which may contain a carbonyl, ester or ether moiety. $Z^3$ is a single bond, methylene, ethylene, phenylene, fluorinated phenylene, —O—$R^{33}$—, or —C(=O)—$Z^4$—$R^{33}$— wherein $Z^4$ is oxygen or NH and $R^{33}$ is a straight, branched or cyclic $C_1$-$C_6$ alkylene group, phenylene or alkenylene group, which may contain a carbonyl, ester, ether or hydroxyl moiety. M$^-$ is a non-nucleophilic counter ion. Molar fractions d1 to d3 are in the range: $0 \leq d1 \leq 0.5$, $0 \leq d2 \leq 0.5$, and $0 \leq d3 \leq 0.5$. When any one or more of recurring units (d1) to (d3) are copolymerized, one or more d's are positive numbers satisfying $0<d1+d2+d3 \leq 0.5$.

Binding an acid generator to the polymer main chain is effective in restraining acid diffusion, thereby preventing a reduction of resolution due to blur by acid diffusion. Also edge roughness (LER or LWR) is improved since the acid generator is uniformly dispersed.

Examples of the non-nucleophilic counter ion represented by M$^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

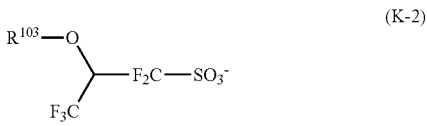

In formula (K-1), $R^{102}$ is hydrogen, or a straight, branched or cyclic $C_1$-$C_{20}$ alkyl, $C_2$-$C_{20}$ alkenyl or $C_5$-$C_{20}$ aryl group, which may have an ether, ester, carbonyl moiety, lactone ring or fluorine. In formula (K-2), $R^{103}$ is hydrogen, or a straight, branched or cyclic $C_1$-$C_{30}$ alkyl, acyl, $C_2$-$C_{20}$ alkenyl, $C_6$-$C_{20}$ aryl or aryloxy group, which may have an ether, ester, carbonyl moiety or lactone ring.

It is noted that when a polymer having copolymerized therein recurring units of any type in formula (4) is used as base resin in a resist composition, the addition of a photoacid generator to be described later may be omitted.

Besides the recurring units (a1), (a2), (b), (c) and (d), additional recurring units (e) may be copolymerized in the polymer, which include recurring units derived from styrene, vinylnaphthalene, vinylanthracene, vinylpyrene, methyleneindane, and the like.

The polymer may be synthesized by any desired methods, for example, by dissolving one or more monomers selected from the monomers to form the recurring units (a) to (e) in an organic solvent, adding a radical polymerization initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethylvaleronitrile), dimethyl 2,2-azobis (2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the copolymer, recurring units (a) to (e) may be incorporated in the following molar fraction:

$0<a1<1.0$, preferably $0.1 \leq a1 \leq 0.9$, and more preferably $0.2 \leq a1 \leq 0.8$;

$0 \leq a2 <1.0$, preferably $0 \leq a2 \leq 0.7$, and more preferably $0 \leq a2 \leq 0.6$;

$0<b<1.0$, preferably $0.1 \leq b \leq 0.9$, and more preferably $0.2 \leq b \leq 0.8$;

$0<a1+a2+b \leq 1.0$, preferably $0.2 \leq a1+a2+b \leq 1.0$, and more preferably $0.4 \leq a1+a2+b \leq 1.0$;

$0 \leq c \leq 0.9$, preferably $0 \leq c \leq 0.8$, and more preferably $0 \leq c \leq 0.7$;

$0 \leq d \leq 0.5$, preferably $0 \leq d \leq 0.45$, and more preferably $0 \leq d \leq 0.4$;

$0 \leq e \leq 0.5$, preferably $0 \leq e \leq 0.4$, and more preferably $0 \leq e \leq 0.3$; and $a1+a2+b+c+d+e=1.0$.

The polymer serving as the base resin in the resist composition should preferably have a weight average molecular weight (Mw) in the range of 1,000 to 500,000, and more preferably 2,000 to 30,000, as measured by gel permeation chromatography (GPC) versus polystyrene standards using tetrahydrofuran solvent. With too low a Mw, the resist composition may become less heat resistant. A polymer with too high a Mw may lose alkaline solubility and give rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable as well as a blend of the inventive polymer and a polymer free of units (a1).

The polymer is advantageously used as a base resin in a positive resist composition, typically chemically amplified positive resist composition. Specifically, the polymer is used as a base resin and combined with any desired components (to be described below) to formulate a positive resist composition. This positive resist composition has a very high sensitivity in that the dissolution rate in developer of the polymer in exposed areas is accelerated by catalytic reaction. In addition, the resist film has a high dissolution contrast, resolution, exposure latitude, and process adaptability, and provides a good pattern profile after exposure, yet better etching resistance, and minimal proximity bias because of restrained acid diffusion. By virtue of these advantages, the composition is fully useful in commercial application and suited as a pattern-forming material for the fabrication of VLSIs or photomasks. Particularly when an acid generator is incorporated to formulate a chemically amplified positive resist composition capable of utilizing acid catalyzed reaction, the composition has a higher sensitivity and is further improved in the properties described above.

The positive resist composition may include an acid generator in order for the composition to function as a chemically amplified positive resist composition. Typical of the acid generator used herein is a photoacid generator (PAG) capable of generating an acid in response to actinic light or radiation. It is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The acid generators may be used alone or in admixture of two or more. Exemplary acid generators are described in U.S. Pat. No. 7,537,880 (JP-A 2008-111103, paragraphs [0122]-[0142]).

The positive resist composition may further comprise an organic solvent, basic compound, dissolution regulator, surfactant, and acetylene alcohol, alone or in combination. Inclusion of a dissolution regulator may lead to an increased difference in dissolution rate between exposed and unexposed areas and a further improvement in resolution. Addition of a basic compound may be effective in suppressing the diffusion rate of acid in the resist film, achieving a further improvement in resolution. Addition of a surfactant may improve or control the coating characteristics of the resist composition.

Examples of the organic solvent used herein are described in JP-A 2008-111103 (U.S. Pat. No. 7,537,880), paragraphs [0144]-[0145], exemplary basic compounds in paragraphs [0146]-[0164], and exemplary surfactants in paragraphs [0165]-[0166]. Exemplary dissolution regulators are described in JP-A 2008-122932 (US 2008090172), paragraphs [0155]-[0178], and exemplary acetylene alcohols in paragraphs [0179]-[0182]. Also useful are quenchers of polymer type as described in JP-A 2008-239918. The polymeric quencher segregates at the resist surface after coating and thus enhances the rectangularity of resist pattern. When a protective film is applied as is often the case in the immersion lithography, the polymeric quencher is also effective for preventing any film thickness loss of resist pattern or rounding of pattern top.

An appropriate amount of the acid generator used is 0.01 to 100 parts, and preferably 0.1 to 80 parts. An appropriate amount of the organic solvent used is 50 to 10,000 parts, especially 100 to 5,000 parts. The dissolution regulator may be blended in an amount of 0 to 50 parts, preferably 0 to 40 parts, the basic compound in an amount of 0 to 100 parts, preferably 0.001 to 50 parts, and the surfactant in an amount of 0 to 10 parts, preferably 0.0001 to 5 parts. All amounts are expressed in parts by weight relative to 100 parts by weight of the base resin.

Process

The positive resist composition, typically chemically amplified positive resist composition comprising a polymer having acid labile group-bearing units of formula (1), an acid generator, and a basic compound in an organic solvent is used in the fabrication of various integrated circuits. Pattern formation using the resist composition may be performed by well-known lithography processes. The process generally involves coating, prebake, exposure, bake (PEB), and development. If necessary, any additional steps may be added.

The positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, MoSi, or $SiO_2$) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick. If desired, a protective film may be formed on the resist film. The protective film is preferably formed of an alkaline developer-soluble composition so that both formation of a resist pattern and stripping of the protective film may be achieved during development. The protective film has the functions of restraining outgassing from the resist film, filtering or cutting off out-of-band (OOB) light having a wavelength of 140 to 300 nm emitted by the EUV laser (other than 13.5 nm), and preventing the resist film from assuming T-top profile or from losing its thickness under environmental impacts.

The resist film is then exposed to a desired pattern of high-energy radiation such as UV, deep-UV, EB, x-ray, excimer laser light, γ-ray, synchrotron radiation or EUV (soft x-ray). directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as t-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

Alternatively, a negative tone pattern may be formed by organic solvent development. The organic solvent used as the developer is preferably selected from 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, isopentyl acetate, butenyl acetate, phenyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate. These organic solvents may be used alone or in admixture of two or more.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyolohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-l-butanol, 3-methyl-1-butanol, 3-methyl-3-pentanol, o cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-t-pentyl ether, and di-n-hexyl ether. The solvents may be used alone or in admixture. Besides the foregoing solvents, aromatic solvents may be used, for example, toluene, xylene, ethylbenzene, isopropylbenzene, t-butylbenzene and mesitylene.

EXAMPLE

Synthesis Examples, Comparative Synthesis Examples, Examples and Comparative Examples are given below for further illustrating the invention, but they should not be construed as limiting the invention thereto. Mw is a weight average molecular weight as measured by gel permeation chromatography (GPC) versus polystyrene standards using tetrahydrofuran (THF) solvent, and Mw/Mn designates molecular weight distribution or dispersity. All parts (pbw) are by weight.

Monomers 1 to 3 and PAG Monomers 1, 2 are first described.

Monomer Synthesis

Polymerizable acid-labile compounds or monomers within the scope of the invention were synthesized as follows.

Monomer Synthesis Example 1

To a mixture of 20.8 g of 3-hydroxy-5-acetylphenyl methacrylate, 0.3 g of methanesulfonic acid, and 100 g of toluene under ice cooling, 80 g of methylenecyclohexane was added over 4 hours. The reaction solution was quenched by adding 50 g of water. An organic layer was taken out, washed in sequence with water, sodium hydrogencarbonate water, and saturated saline, and concentrated. The concentrate was purified by distillation, yielding 3-cyclohexyloxymethoxy-5-acetylphenyl methacrylate, designated Monomer 1.

Monomer Synthesis Example 2

The procedure of Monomer Synthesis Example 1 was repeated aside from using 3-hydroxy-5-methoxycarbonyl-phenyl methacrylate instead of 3-hydroxy-5-acetylphenyl methacrylate. There was obtained 3-cyclohexyloxymethoxy-5-methoxycarbonyl-phenyl methacrylate, designated Monomer 2.

Monomer Synthesis Example 3

The procedure of Monomer Synthesis Example 1 was repeated aside from using 2-methyleneadamantane instead of methylenecyclohexane. There was obtained 3-(2-adamantyloxy-methoxy)-5-acetylphenyl methacrylate, designated Monomer 3.

Monomers 1 to 3 have the following structure.

Monomer 1

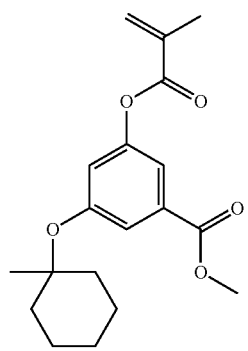

Monomer 2

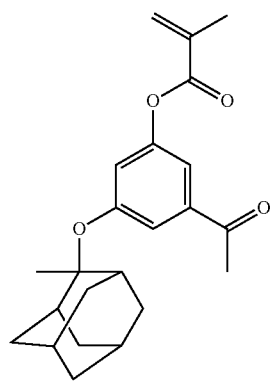

Monomer 3

Monomer 1: 3-cyclohexyloxymethoxy-5-acetylphenyl methacrylate

Monomer 2: 3-cyclohexyloxymethoxy-5-methoxycarbonyl-phenyl methacrylate

Monomer 3: 3-(2-adamantyloxymethoxy)-5-acetylphenyl methacrylate

PAG Monomer 1

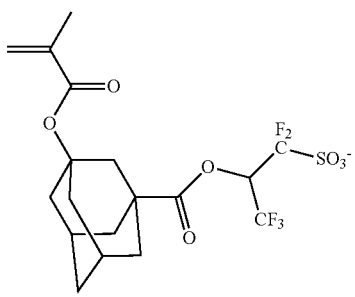

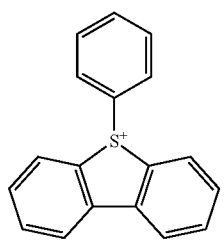

-continued

PAG Monomer 2

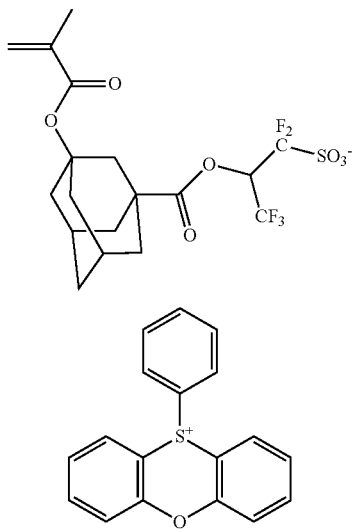

PAG Monomer 1: 5-phenyldibenzothiophenium 1,1,3,3,3-pentafluoro-2-(3-methacryloyloxy-adamantane-1-carbonyloxy)-propane-1-sulfonate PAG Monomer 2: 10-phenylphenoxathiinium 1,1,3,3,3-pentafluoro-2-(3-methacryloyloxy-adamantane-1-carbonyloxy)-propane-1-sulfonate Polymer Synthesis

Synthesis Example 1

A 2-L flask was charged with 11.1 g of Monomer 1, 8.1 g of 4-hydroxyphenyl methacrylate, 4.5 g of 3-oxo-2,7-dioxatricyclo[4.2.1.0$^{4,8}$]nonan-9-yl methacrylate, and 40 g of THF solvent. The reactor was cooled down to −70° C. in a nitrogen atmosphere, whereupon vacuum evacuation and nitrogen blow were repeated three times. The reactor warmed up to room temperature whereupon 1.2 g of azobisisobutyronitrile (AIBN) was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 1: 4-hydroxyphenyl methacrylate:3-oxo-2,7-dioxatricyclo[4.2.1.0$^{4,8}$]nonan-9-yl methacrylate=0.35:0.45:0.20

Mw=7,700

Mw/Mn=1.76

This is designated Polymer 1.

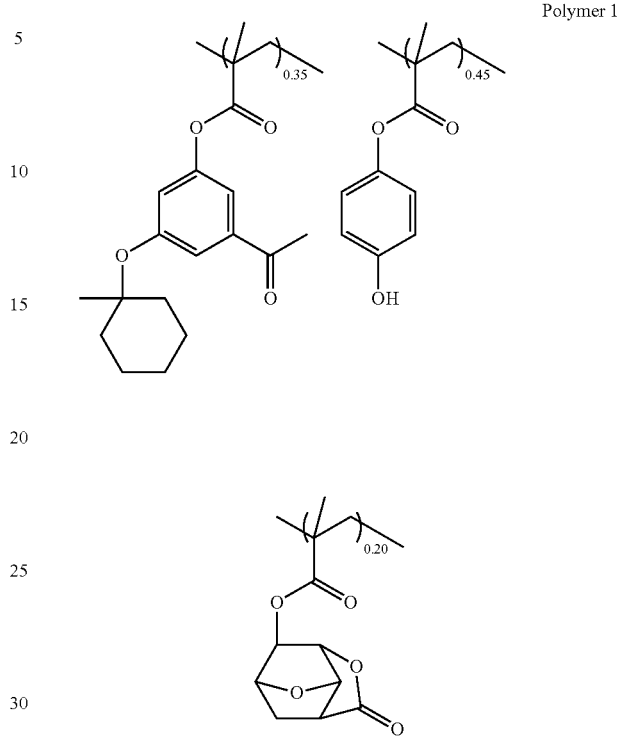

Polymer 1

Synthesis Example 2

A 2-L flask was charged with 1.4 g of 3-ethyl-3-exo-tetracyclo[4.4.0.1$^{2,5}$.1$^{7,10}$]dodecanyl methacrylate, 10.0 g of Monomer 2, 4.1 g of 4-hydroxy-3,5-dimethylphenyl methacrylate, 6.7 g of 3-oxo-2,7-dioxatricyclo[4.2.1.0$^{4,8}$]-nonan-9-yl methacrylate, 11.0 g of PAG Monomer 1, and 40 g of THF solvent. The reactor was cooled down to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

3-ethyl-3-exo-tetracyclo[4.4.0.1$^{2,5}$.1$^{7,10}$]dodecanyl methacrylate:Monomer 2:4-hydroxy-3,5-dimethylphenyl methacrylate:3-oxo-2,7-dioxatricyclo[4.2.1.0$^{4,8}$] nonan-9-yl methacrylate:PAG Monomer 1=0.05:0.30:0.20:0.30:0.15

Mw=9,700

Mw/Mn=1.71

This is designated Polymer 2.

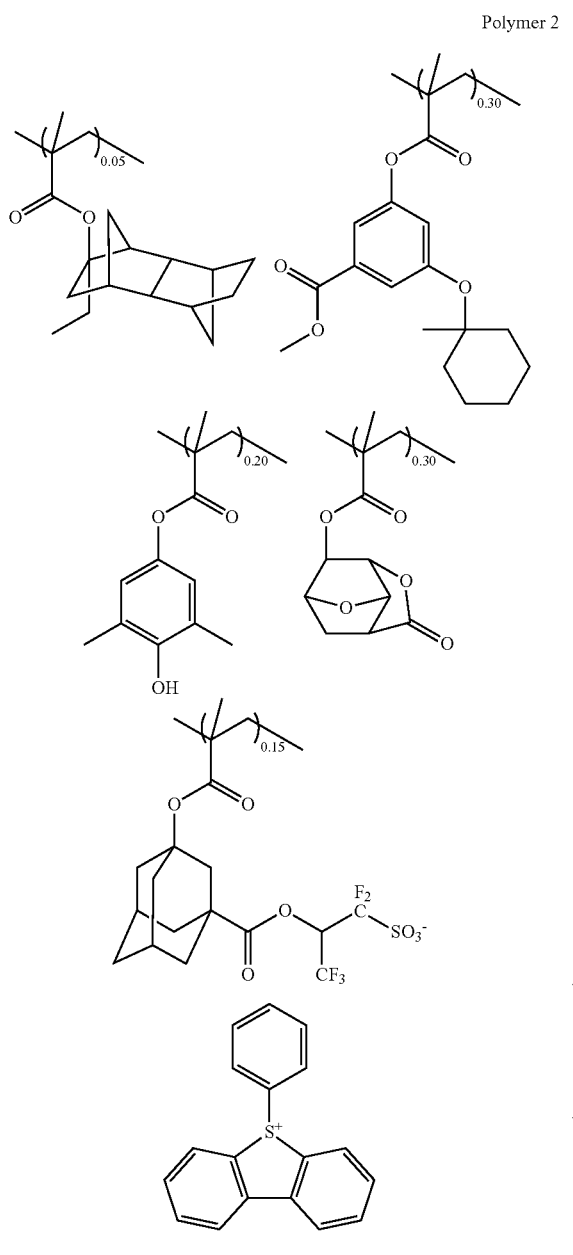

Polymer 2

Synthesis Example 3

A 2-L flask was charged with 14.7 g of Monomer 3, 4.4 g of 3-hydroxy-5-acetylphenyl methacrylate, 7.5 g of 2-oxo-oxolan-3-yl methacrylate, 11.0 g of PAG Monomer 2, and 40 g of THF solvent. The reactor was cooled down to −70° C. in a nitrogen atmosphere, whereupon vacuum evacuation and nitrogen blow were repeated three times. The reactor warmed up to room temperature whereupon 1.2 g of AIBN was added as a polymerization initiator. The reactor was heated at 60° C. and reaction run for 15 hours. The reaction solution was precipitated from 1 L of isopropyl alcohol. The white solid was collected by filtration and vacuum dried at 60° C., obtaining a white polymer.

The polymer was analyzed by $^{13}$C-NMR, $^1$H-NMR, and GPC, with the analytical data shown below.

Copolymer Composition (Molar Ratio)

Monomer 3 :3-hydroxy-5-acetylphenyl methacrylate:2-oxo-oxolan-3-yl methacrylate:PAG Monomer 2=0.40:0.20:0.25:0.15

Mw=9,700

Mw/Mn=1.63

This is designated Polymer 3.

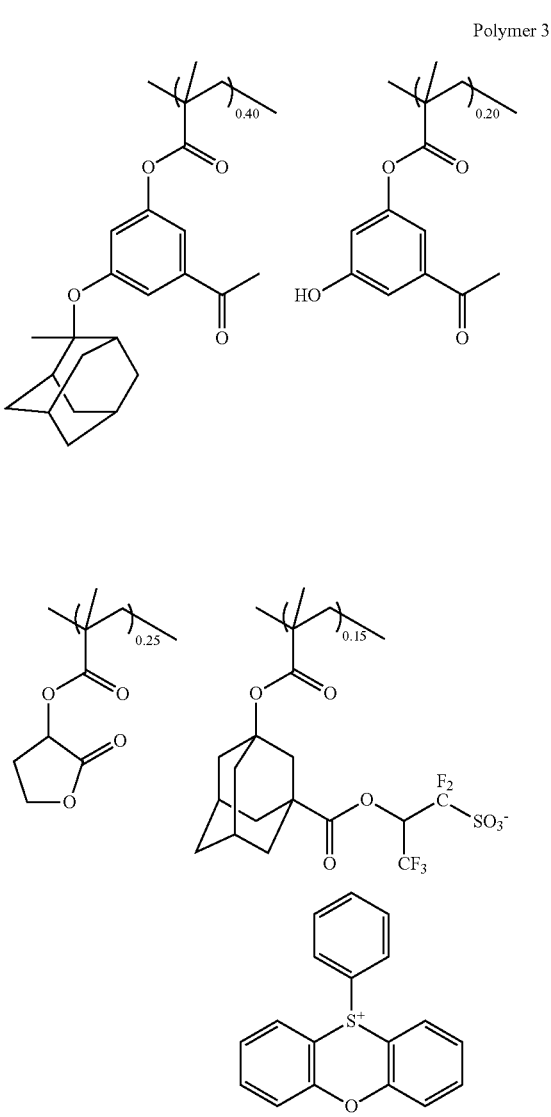

Polymer 3

Comparative Synthesis Example 1

A polymer was synthesized by the same procedure as above.

Copolymer Composition (Molar Ratio)

3-cyclohexyloxymethoxyphenyl methacrylate:4-hydroxyphenyl methacrylate:3-oxo-2,7-dioxatricyclo[4.2.1.0$^{4,8}$]nonan-9-yl methacrylate=0.35:0.45:0.20

Mw=9,900

Mw/Mn=1.91

This is designated Comparative Polymer 1.

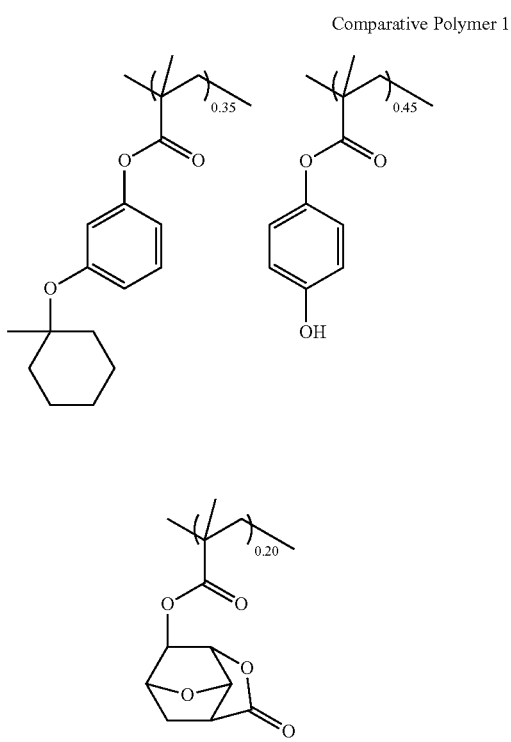

Comparative Polymer 1

Comparative Synthesis Example 2

A polymer was synthesized by the same procedure as above.

Copolymer Composition (Molar Ratio)

3-ethyl-3-exo-tetracyclo[4.4.0.1$^{2,5}$.1$^{7,10}$]dodecanyl methacrylate:4-hydroxyphenyl methacrylate:3-oxo-2,7-dioxatricyclo[4.2.1.0$^{4,8}$]nonan-9-yl methacrylate:PAG Monomer 1=0.30:0.20:0.40:0.10

Mw=7,300

Mw/Mn=1.88

This is designated Comparative Polymer 2.

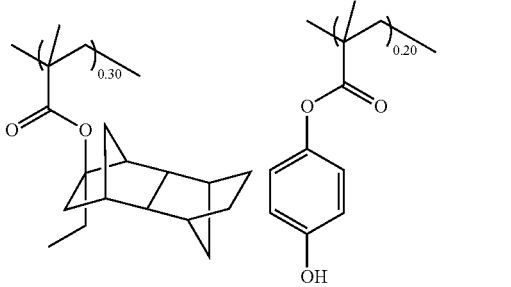

Comparative Polymer 2

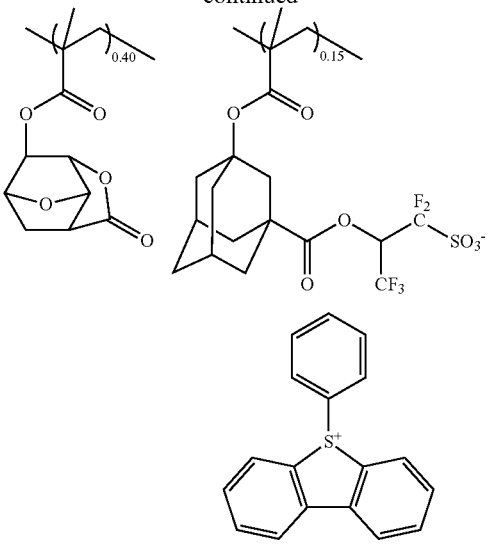

Examples and Comparative Examples

Positive resist compositions were prepared by dissolving each of the polymers synthesized above and selected components in a solvent in accordance with the recipe shown in Table 1, and filtering through a filter having a pore size of 0.2 µm. The solvent contained 100 ppm of a surfactant FC-4430 (3M Sumitomo Co., Ltd.).

The components in Table 1 are as identified below.

Polymers 1 to 3: polymers synthesized in
   Synthesis Examples 1 to 3

Comparative Polymers 1, 2:
   polymers synthesized in Comparative Synthesis Examples 1, 2

Organic solvents: propylene glycol monomethyl ether acetate (PGMEA)
   propylene glycol monomethyl ether (PGME)
   cyclohexanone (CyH)
   cyclopentanone (CyP)

Acid generators: PAG1, PAG2 of the following structural formulae

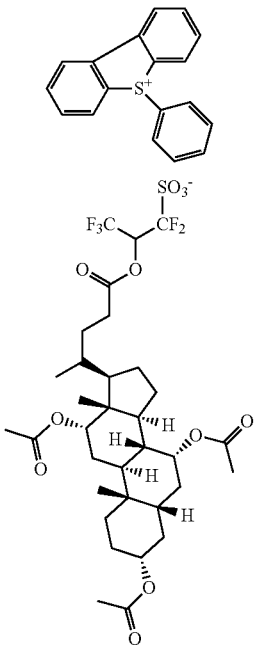

PAG 1

-continued

PAG 2

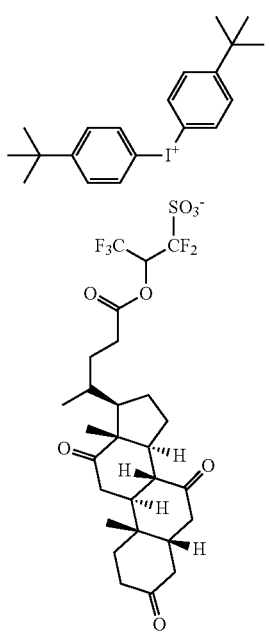

EB Writing Test

Using a coater/developer system Clean Track Mark 5 (Tokyo Electron Ltd.), the positive resist composition prepared above was spin coated onto a silicon substrate of diameter 6 inches (which had been vapor primed with hexamethyldisilazane (HMDS)) and pre-baked on a hot plate at 110° C. for 60 seconds to form a resist film of 100 nm thick. Using a system HL-800D (Hitachi Ltd.) at a HV voltage of 50 kV, the resist film was exposed imagewise to EB in a vacuum chamber.

Using Clean Track Mark 5, immediately after the exposure, the resist film was baked (PEE) on a hot plate at the temperature shown in Table 1 for 60 seconds and puddle developed in a 2.38 wt % TMAH aqueous solution for 30 seconds to form a positive pattern.

Resolution is a minimum size at the exposure dose (sensitivity) that provides a 1:1 resolution of a 100-nm line-and-space pattern. The 100-nm L/S pattern was measured for roughness (LWR) under SEM.

The resist composition is shown in Table 1 together with the sensitivity and resolution of EB lithography.

TABLE 1

|  |  | Polymer (pbw) | Acid generator (pbw) | Basic compound (pbw) | Organic solvent (pbw) | PEB temp. (° C.) | Sensitivity ($\mu C/cm^2$) | Resolution (nm) | LWR (nm) |
|---|---|---|---|---|---|---|---|---|---|
| Example | 1-1 | Polymer 1 (100) | PAG 1 (30) | Quencher 1 (1.0) | PGMEA (1,500) CyH (200) | 85 | 22.6 | 75 | 5.9 |
|  | 1-2 | Polymer 2 (100) | — | Quencher 1 (1.0) | PGMEA (500) CyH (1,300) | 80 | 21.6 | 75 | 5.1 |
|  | 1-3 | Polymer 3 (100) | — | Quencher 1 (1.0) | PGMEA (500) CyH (1,300) | 85 | 27.3 | 75 | 5.4 |
|  | 1-4 | Polymer 3 (100) | PAG 1 (15) | Quencher 1 (1.0) | PGMEA (500) CyH (1,300) | 80 | 25.6 | 75 | 4.6 |
|  | 1-5 | Polymer 3 (100) | PAG 2 (15) | Quencher 2 (0.6) | PGMEA (500) CyP (1,400) | 80 | 26.6 | 75 | 4.2 |
| Comparative Example | 1-1 | Comparative Polymer 1 (100) | PAG 1 (30) | Quencher 1 (1.0) | PGMEA (1,500) CyH (200) | 85 | 26.6 | 85 | 6.7 |
|  | 1-2 | Comparative Polymer 2 (100) | — | Quencher 1 (1.0) | PGMEA (500) CyH (1,300) | 85 | 26.6 | 80 | 6.7 |

Basic compounds: Quencher 1, Quencher 2 of the following structural formulae

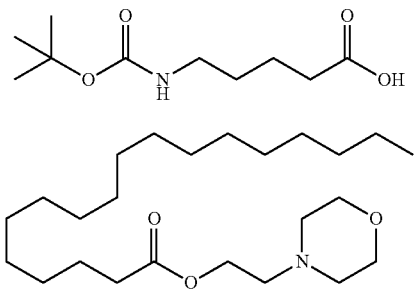

Quencher 1

Quencher 2

EUV Lithography Test

The positive resist composition prepared above was spin coated onto a silicon substrate of diameter 4 inches (which had been vapor primed with HMDS) and pre-baked on a hot plate at 105° C. for 60 seconds to form a resist film of 40 nm thick. Using an exposure tool (NA 0.3, dipole illumination), the resist film was exposed imagewise to EUV.

Immediately after the exposure, the resist film was baked (PEB) on a hot plate at the temperature shown in Table 2 for 60 seconds and puddle developed in a 2.38 wt % TMAH aqueous solution for 30 seconds to form a positive pattern.

Resolution is a minimum size at the exposure dose (sensitivity) that provides a 1:1 resolution of a 30-nm line-and-space pattern. The 30-nm L/S pattern was measured for roughness (LWR) under SEM.

The resist composition is shown in Table 2 together with the sensitivity and resolution of EUV lithography.

TABLE 2

| | Polymer (pbw) | Acid generator (pbw) | Basic compound (pbw) | Organic solvent (pbw) | PEB temp. (° C.) | Sensitivity (mJ/cm$^2$) | Resolution (nm) | LWR (nm) |
|---|---|---|---|---|---|---|---|---|
| Example 2-1 | Polymer 2 (100) | — | Quencher 1 (1.0) | PGMEA (1,000) CyH (2,000) PGME (500) | 80 | 19 | 18 | 4.5 |
| Comparative Example 2-1 | Comparative Polymer 2 (100) | — | Quencher 1 (1.0) | PGMEA (1,000) CyH (2,000) PGME (500) | 85 | 20 | 23 | 5.1 |

Japanese Patent Application No. 2015-124100 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer comprising recurring units (a1) having the general formula (1):

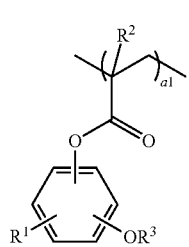

(1)

wherein $R^1$ is —C(=O)—$R^4$, —O—C(=O)—$R^4$ or —C(=O)—O—$R^4$, $R^2$ is hydrogen or methyl, $R^3$ is an acid labile group, and $R^4$ is a straight or branched $C_1$-$C_4$ alkyl group or $C_2$-$C_4$ alkenyl group, the polymer having a weight average molecular weight of 1,000 to 500,000.

2. The polymer of claim 1 wherein $R^3$ is an acid labile group selected from the group consisting of t-butyl, t-pentyl, methylcyclopentyl, ethylcyclopentyl, methylcyclohexyl, ethylcyclohexyl, methyladamantyl, ethyladamantyl, t-butoxycarbonyl, t-pentyloxycarbonyl and —C$R^5R^6$—O—$R^7$ wherein $R^5$ and $R^6$ are each independently hydrogen or a straight or branched $C_1$-$C_4$ alkyl group, and $R^7$ is a straight, branched or cyclic $C_1$-$C_{12}$ alkyl group or $C_2$-$C_{12}$ alkenyl group.

3. The polymer of claim 1, further comprising recurring units (b) having an adhesive group selected from the group consisting of hydroxyl, carboxyl, lactone ring, carbonate, thiocarbonate, carbonyl, cyclic acetal, ether, ester, sulfonic acid ester, cyano, amide, and —O—C(=O)—G— wherein G is sulfur or NH, the recurring units (a1) and (b) being incorporated in a fraction: 0<a1<1.0, 0<b<1.0, and 0.05≤a1+b≤1.0.

4. The polymer of claim 3 wherein the recurring units (b) are units having a phenolic hydroxyl group.

5. The polymer of claim 4 wherein the recurring units having a phenolic hydroxyl group are units selected from the group consisting of recurring units represented by the general formula (2) and mixtures thereof:

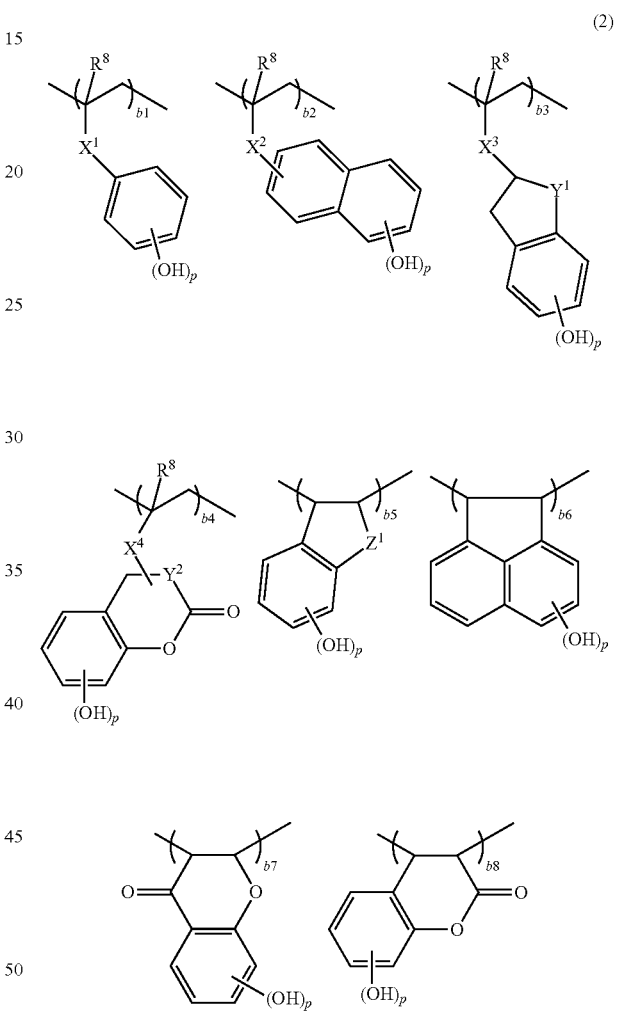

(2)

wherein $R^8$ is hydrogen or methyl, $X^1$ and $X^2$ each are a single bond or —C(=O)—O—$R^9$—, $X^3$ and $X^4$ each are —C(=O)—O—$R^9$—, $R^9$ is a single bond or a straight, branched or cyclic $C_1$—$C_{10}$ alkylene group, $Y^1$ and $Y^2$ each are methylene or ethylene, $Z^1$ is methylene, oxygen or sulfur, p is 1 or 2, b1 to b8 are numbers representing fractions incorporated in the polymer, the sum of b1 to b8 represents the fraction b incorporated in the polymer, and b1 to b8 are in the range: 0≤b1<1.0, 0≤b2<1.0, 0≤b3<1.0, 0≤b4<1.0, 0≤b5<1.0, 0≤b6<1.0, 0≤b7<1.0, 0≤b8<1.0, and 0<b1+b2+b3+b4+b5+b6+b7+b8<1.0.

6. The polymer of claim 1, further comprising recurring units (a2) having the general formula (5):

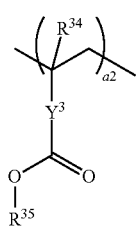

(5)

wherein $R^{34}$ is hydrogen or methyl, $R^{35}$ is an acid labile group, $Y^3$ is a single bond, a divalent $C_1$-$C_{12}$ linking group having an ester moiety, ether moiety or lactone ring, phenylene group or naphthylene group, a2 is a number representing a fraction of recurring unit (a2) incorporated in the polymer, and is in the range: $0 < a2 < 1.0$.

7. The polymer of claim 1, further comprising recurring units (c) selected from the group consisting of recurring units of derivatives of: indene, acenaphthylene, chromone, coumarin, and norbornadiene represented by the general formula (3), and mixtures thereof:

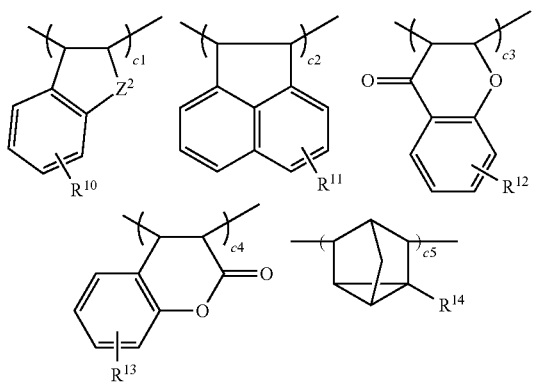

(3)

wherein $R^{10}$ to $R^{14}$ are each independently hydrogen, $C_1$-$C_{30}$alkyl, halo-substituted $C_1$-$C_{30}$ alkyl, $C_1$-$C_8$ alkoxy, $C_1$-$C_8$ alkanoyl, $C_2$-$C_8$ alkoxycarbonyl, $C_6$-$C_{10}$ aryl, halogen, or 1,1,1,3,3,3-hexafluoro-2-propanol, $Z^2$ is methylene, oxygen or sulfur, c1 to c5 are numbers representing fractions incorporated in the polymer, and c1 to c5 are in the range: $0 \leq c1 < 1.0$, $0 \leq c2 < 1.0$, $0 \leq c3 < 1.0$, $0 \leq c4 < 1.0$, $0 \leq c5 < 1.0$, and $0 < c1+c2+c3+c4+c5 < 1.0$.

8. The polymer of claim 1, further comprising recurring units (d) derived from an onium salt having polymerizable olefin as an acid generator, the recurring units (d) being units selected from the group consisting of recurring units of sulfonium salt, represented by the general formula (4), and mixtures thereof:

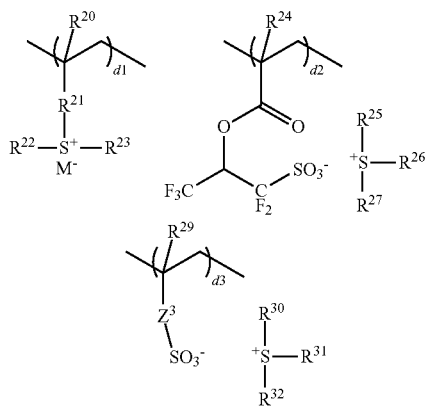

(4)

wherein $R^{20}$, $R^{24}$, and $R^{29}$ each are hydrogen or methyl, $R^{21}$ is a single bond, phenylene, —O—$R^{28}$—, or —C(=O)—$Y^4$—$R^{28}$—, $Y^4$ is oxygen or NH, $R^{28}$ is a straight, branched or cyclic $C_1$-$C_6$ alkylene, phenylene or alkenylene group, which may contain a carbonyl, ester, ether or hydroxyl moiety, $R^{22}$, $R^{23}$, $R^{25}$, $R^{26}$, $R^{27}$, $R^{30}$, $R^{31}$, and $R^{32}$ are each independently a straight, branched or cyclic $C_1$-$C_{12}$ alkyl, $C_6$-$C_{12}$ aryl or $C_7$-$C_{20}$ aralkyl group, which may contain a carbonyl, ester or ether moiety, $Z^3$ is a single bond, methylene, ethylene, phenylene, fluorophenylene, —O—$R^{33}$—, or —C(=O)—$Z^4$—$R^{33}$—, $Z^4$ is oxygen or NH, $R^{33}$ is a straight, branched or cyclic $C_1$-$C_6$ alkylene, phenylene or alkenylene group, which may contain a carbonyl, ester, ether or hydroxyl moiety, M$^-$ is a non-nucleophilic counter ion, d1, d2 and d3 are numbers representing fractions incorporated in the polymer, and d1, d2 and d3 are in the range of $0 \leq d1 \leq 0.5$, $0 \leq d2 \leq 0.5$, $0 \leq d3 \leq 0.5$, and $0 < d1+d2+d3 \leq 0.5$.

9. A chemically amplified positive resist composition comprising the polymer of claim 1, and an organic solvent.

10. The resist composition of claim 9, further comprising a dissolution regulator.

11. The resist composition of claim 9, further comprising at least one additive selected from the group consisting of an acid generator, a basic compound and a surfactant.

12. A pattern forming process comprising the steps of coating the positive resist composition of claim 9 onto a substrate, baking the coating to form a resist film, exposing the resist film to high-energy radiation, and developing the exposed resist film in a developer.

13. The process of claim 12 wherein the high-energy radiation is KrF excimer laser, ArF excimer laser, soft X-ray of wavelength 3 to 15 nm, or electron beam.

* * * * *